(12) United States Patent
Rehder

(10) Patent No.: US 12,490,523 B2
(45) Date of Patent: Dec. 2, 2025

(54) SOLAR CELL ARRAY WITH CHANGEABLE STRING LENGTH

(71) Applicant: The Boeing Company, Chicago, IL (US)

(72) Inventor: Eric Rehder, Los Angeles, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 15/787,291

(22) Filed: Oct. 18, 2017

(65) Prior Publication Data

US 2018/0358497 A1    Dec. 13, 2018

Related U.S. Application Data

(63) Continuation-in-part of application No. 15/643,274, filed on Jul. 6, 2017, and a continuation-in-part of application No. 15/643,282, filed on Jul. 6, 2017, and a continuation-in-part of application No. 15/643,279, filed on Jul. 6, 2017, and a continuation-in-part of application No. 15/643,289, filed on Jul. 6, 2017, now Pat. No. 11,437,533, and a continuation-in-part of application No. 15/643,285, filed on Jul. 6, 2017, and a continuation-in-part of application No. 15/643,287,
(Continued)

(51) Int. Cl.
*H10F 19/90*    (2025.01)
*H10F 19/00*    (2025.01)
*H10F 19/70*    (2025.01)
*H10F 77/00*    (2025.01)

(52) U.S. Cl.
CPC .......... *H10F 19/902* (2025.01); *H10F 19/00* (2025.01); *H10F 19/70* (2025.01); *H10F 77/935* (2025.01)

(58) Field of Classification Search
CPC .......... H01L 31/0504; H01L 31/02008; H01L 31/042; H01L 31/044; H10F 77/935; H10F 19/902; H10F 19/70; H10F 19/00
See application file for complete search history.

(56) References Cited

U.S. PATENT DOCUMENTS 3,376,164 A    4/1968    Bachwansky
3,833,426 A    9/1974    Mesch
(Continued)

FOREIGN PATENT DOCUMENTS

CN    103155158 A    6/2013
CN    203277428 U    11/2013
(Continued)

OTHER PUBLICATIONS

Final Office Action dated Jan. 15, 2019 for Utility U.S. Appl. No. 15/643,277.
(Continued)

*Primary Examiner* — Uyen M Tran
(74) *Attorney, Agent, or Firm* — MH2 Technology Law Group LLP

(57) ABSTRACT

A solar cell array comprised of one or more solar cells attached to a substrate. The substrate includes one or more electrical connections to the solar cells and one or more switches for changing a string length for one or more of the solar cells by altering a current flow path between the one or more of the solar cells and one or more of the electrical connections.

20 Claims, 29 Drawing Sheets

Related U.S. Application Data filed on Jul. 6, 2017, now Pat. No. 10,763,383, and a continuation-in-part of application No. 15/643,277, filed on Jul. 6, 2017.

(60) Provisional application No. 62/518,131, filed on Jun. 12, 2017, provisional application No. 62/518,125, filed on Jun. 12, 2017.

(56) References Cited

U.S. PATENT DOCUMENTS

| | | | |
|---|---|---|---|
| 4,057,439 | A | 11/1977 | Lindmayer |
| 4,257,821 | A | 3/1981 | Kelly et al. |
| 4,481,378 | A | 11/1984 | Lesk |
| 4,755,231 | A | 7/1988 | Kurland et al. |
| 5,330,583 | A | 7/1994 | Asai et al. |
| 5,391,235 | A | 2/1995 | Inoue |
| 5,567,248 | A | 10/1996 | Chung |
| 5,701,067 | A | 12/1997 | Kaji et al. |
| 5,855,692 | A | 1/1999 | Kaji et al. |
| 6,008,448 | A | 12/1999 | Peck |
| 6,034,322 | A * | 3/2000 | Pollard .............. H01L 27/142 136/244 |
| 6,156,967 | A * | 12/2000 | Ralph ............ H01L 31/022441 136/244 |
| 6,313,396 | B1 * | 11/2001 | Glenn ................ H01L 31/042 136/244 |
| 6,350,944 | B1 | 2/2002 | Sherif et al. |
| 6,441,297 | B1 * | 8/2002 | Keller ............ H01L 31/035281 136/249 |
| 6,543,725 | B1 | 4/2003 | Meurer et al. |
| 6,555,739 | B2 | 4/2003 | Kawam |
| 6,563,289 | B1 | 5/2003 | Cross |
| 6,637,702 | B1 | 10/2003 | McCandless |
| 8,604,330 | B1 | 12/2013 | Hennessy et al. |
| 8,814,099 | B1 | 8/2014 | Harvey et al. |
| 9,120,583 | B1 | 9/2015 | Spence et al. |
| 9,758,261 | B1 * | 9/2017 | Steinfeldt ......... H01L 31/06875 |
| 2003/0057533 | A1 * | 3/2003 | Lemmi ...................... B41J 2/45 257/E31.062 |
| 2004/0118446 | A1 | 6/2004 | Toyomura |
| 2005/0133079 | A1 | 6/2005 | Boulanger et al. |
| 2006/0170435 | A1 | 8/2006 | Granicher et al. |
| 2007/0005843 | A1 | 1/2007 | Sim et al. |
| 2007/0152194 | A1 | 7/2007 | Natekar et al. |
| 2008/0142071 | A1 | 6/2008 | Dorn et al. |
| 2008/0245405 | A1 | 10/2008 | Garvison et al. |
| 2008/0295889 | A1 | 12/2008 | Schindler et al. |
| 2009/0183760 | A1 | 7/2009 | Meyer |
| 2009/0255571 | A1 | 10/2009 | Xia et al. |
| 2009/0272436 | A1 | 11/2009 | Cheung |
| 2009/0288702 | A1 | 11/2009 | Kim et al. |
| 2010/0012172 | A1 | 1/2010 | Meakin et al. |
| 2010/0085670 | A1 | 4/2010 | Palaniswami et al. |
| 2010/0089435 | A1 | 4/2010 | Lockenhoff |
| 2010/0126560 | A1 | 5/2010 | Lauvray et al. |
| 2010/0186795 | A1 * | 7/2010 | Gaul ................ H01L 31/02021 136/244 |
| 2010/0212741 | A1 | 8/2010 | Lin |
| 2010/0295383 | A1 | 11/2010 | Cummings |
| 2010/0313954 | A1 | 12/2010 | Seel |
| 2011/0041890 | A1 | 2/2011 | Sheats |
| 2011/0073163 | A1 | 3/2011 | Cheung |
| 2011/0079263 | A1 | 4/2011 | Avrutsky |
| 2011/0120752 | A1 | 5/2011 | Imai et al. |
| 2011/0138609 | A1 | 6/2011 | Chereukupalli |
| 2011/0168238 | A1 | 7/2011 | Metin et al. |
| 2011/0198444 | A1 | 8/2011 | Dong |
| 2012/0103388 | A1 | 5/2012 | Meakin et al. |
| 2012/0125391 | A1 | 5/2012 | Pinarbasi et al. |
| 2012/0161801 | A1 | 6/2012 | Hasegawa |
| 2012/0167954 | A1 | 7/2012 | Meakin et al. |
| 2012/0199176 | A1 | 8/2012 | Hong et al. |
| 2012/0313455 | A1 | 12/2012 | Atham |
| 2013/0014802 | A1 | 1/2013 | Zimmerman |
| 2013/0056047 | A1 | 3/2013 | Beck et al. |
| 2013/0263915 | A1 | 10/2013 | Snidow |
| 2014/0000682 | A1 * | 1/2014 | Zhao .................. H01L 31/0481 136/251 |
| 2014/0033625 | A1 | 2/2014 | Jenkins et al. |
| 2014/0083497 | A1 | 3/2014 | Ehrenpfordt et al. |
| 2014/0166067 | A1 * | 6/2014 | McGlynn .......... H01L 31/06875 136/244 |
| 2014/0255780 | A1 | 9/2014 | Mikhaylik et al. |
| 2014/0366927 | A1 | 12/2014 | Lavrova et al. |
| 2015/0083191 | A1 | 3/2015 | Gmundner |
| 2015/0096607 | A1 | 4/2015 | Yong |
| 2015/0144173 | A1 | 5/2015 | Hoang et al. |
| 2015/0287862 | A1 | 10/2015 | Pardell Vilella |
| 2015/0318420 | A1 | 11/2015 | Sewell et al. |
| 2015/0349703 | A1 | 12/2015 | Morad et al. |
| 2016/0112004 | A1 | 4/2016 | Thiel et al. |
| 2016/0126380 | A1 | 5/2016 | Chang |
| 2016/0197207 | A1 | 7/2016 | Morioka et al. |
| 2016/0218665 | A1 | 7/2016 | Crist |
| 2016/0380221 | A1 | 12/2016 | Gotanda et al. |
| 2017/0018670 | A1 | 1/2017 | Bende et al. |
| 2017/0040933 | A1 | 2/2017 | Vogel |
| 2017/0054406 | A1 | 2/2017 | Narla et al. |
| 2017/0098736 | A1 | 4/2017 | Lee et al. |
| 2017/0163212 | A1 | 6/2017 | France et al. |
| 2017/0229692 | A1 | 8/2017 | Thiel et al. |
| 2017/0374737 | A1 | 12/2017 | Jeong et al. |
| 2019/0127089 | A1 | 5/2019 | Tomoda et al. |
| 2019/0140584 | A1 | 5/2019 | Hayashi et al. |

FOREIGN PATENT DOCUMENTS

| | | |
|---|---|---|
| CN | 104241406 A | 12/2014 |
| CN | 104443439 | 3/2015 |
| CN | 104443439 A | 3/2015 |
| DE | 1013644 | 2/2003 |
| DE | 10136442 | 2/2003 |
| DE | 10136442 A1 | 2/2003 |
| EP | 1160876 | 12/2001 |
| EP | 1548 847 | 6/2005 |
| EP | 2833416 | 2/2015 |
| EP | 2981156 | 2/2016 |
| EP | 3297042 | 3/2018 |
| JP | 2002050782 A | 2/2002 |
| JP | 2002190612 | 7/2002 |
| JP | 2002190612 A | 7/2002 |
| JP | 2010521720 A | 6/2010 |
| JP | 2011071214 | 4/2011 |
| JP | 2011071214 A | 4/2011 |
| JP | 2014508939 A | 4/2014 |
| JP | 2016500998 A | 1/2016 |
| WO | 2009/012567 | 1/2009 |
| WO | 2012122131 A3 | 11/2012 |
| WO | 2014046699 A1 | 3/2014 |

OTHER PUBLICATIONS

Non-Final Office Action dated Dec. 7, 20 for U.S. Appl. No. 15/787,304.

Non-Final Office Action dated Jan. 3, 2020 for U.S. Appl. No. 15/938,787.

Stern, T., et al., "Modular Solar Panels Using Components Engineered for Producibility", Photovoltaic Specialists Conference (PVSC), 2011 37th IEEE, Jun. 19-24, 2011, pp. 001626-001629.

Walmsley, N., et al., "Increasing the TRL Level of New PV Technologies Using Modular Solar Panels", Photovoltaic Specialists Conference (PVSC), 2012 38th IEEE, Jun. 3-8, 2012, pp. 002835-002839.

1 Final Office Action dated Sep. 2, 2020 for U.S. Appl. No. 15/643,274.

Non-Final Office Action dated Feb. 1, 2021 for U.S. Appl. No. 15/643,277.

Non-Final Office Action dated Mar. 24, 2020 for U.S. Appl. No. 15/643,277.

1 Non-Final Office Action dated Jul. 23, 2019 for U.S. Appl. No. 15/643,279.

(56) References Cited

OTHER PUBLICATIONS

Non-Final Office Action dated Mar. 14, 2019 for U.S. Appl. No. 15/787,304.
European Search Report dated Dec. 4, 2017 for EP application No. 17191134.
Non-Final Office Action dated Dec. 22, 2020 for U.S. Appl. No. 15/643,285.
1 Final Office Action dated Feb. 6, 2020 for U.S. Appl. No. 15/643,279.
Final Office Action dated Oct. 1, 2020 for U.S. Appl. No. 15/643,289.
Final Office Action dated Jul. 28, 2020 for U.S. Appl. No. 15/643,277.
Final Office Action dated Mar. 12, 2021 for U.S. Appl. No. 15/643,282.
Non-Final Office Action dated Nov. 9, 2020 for U.S. Appl. No. 15/643,282.
Non-Final Office Action dated Jan. 8, 2020 for U.S. Appl. No. 15/787,304.
Final Office Action dated Jun. 8, 2020 for U.S. Appl. No. 15/643,285.
Non-Final Office Action dated Feb. 21, 2019 for U.S. Appl. No. 15/643,285.
1 Non-Final Office Action dated Jul. 30, 2018 for U.S. Appl. No. 15/643,277.
Extended European Search Report dated Nov. 12, 2018 for EP Application No. 18176222.0.
Notice of Allowance dated Apr. 23, 2020 for U.S. Appl. No. 15/643,287.
Non-Final Office Action dated Oct. 5, 2018 for U.S. Appl. No. 15/643,279.
Final Office Action dated Feb. 6, 2020 for U.S. Appl. No. 15/643,287.
Non-Final Office Action dated Dec. 9, 2019 for U.S. Appl. No. 15/643,282.
Final Office Action dated Apr. 10, 2020 for U.S. Appl. No. 15/643,282.
Extended European Search Report dated Dec. 8, 2017for EP application No. 17191159.7.
Final Office Action dated Mar. 5, 2021 for U.S. Appl. No. 15/643,279.
Non-Final Office Action dated Sep. 27, 2019 for U.S. Appl. No. 15/643,287.
1 Final Office Action dated Apr. 10, 2019 for U.S. Appl. No. 15/643,279
1 Non-Final Office Action dated Feb. 8, 2019 for Utility U.S. Appl. No. 15/643,274.
Final Office Action dated Aug. 6, 2019 for U.S. Appl. No. 15/643,289.
Final Office Action dated Aug. 28, 2018 for U.S. Appl. No. 15/643,289.
Extended European Search Report dated Dec. 7, 2017 for EP application No. 17191154.8.
1 Final Office Action dated Oct. 10, 2019 for U.S. Appl. No. 15/643,277.
Non-Final Office Action dated Mar. 19, 2020 for U.S. Appl. No. 15/643,289.
European Search Report dated Dec. 21, 2017 for EP application No. 17191166.2.
Baumli et al., "Solder Materials With Micro and Nanoparticles: A Review", Materials Science and Engineering, Jan. 1, 2015, pp. 42-49.
Non-Final Office Action dated Feb. 5, 2019 for Utility U.S. Appl. No. 15/643,282.
1 Non-Final Office Action dated Jan. 17, 2020 for U.S. Appl. No. 15/643,285.
1 Non-Final Office Action dated Mar. 31, 2020 for U.S. Appl. No. 15/643,274.
European Examination Communication dated Dec. 1, 2020 for EP Application No. 17191162.1.
Final Office Action dated Jun. 6, 2019 for U.S. Appl. No. 15/643,282.
Non-Final Office Action dated Jul. 28, 2020 for U.S. Appl. No. 15/643,279.
Non-Final Office Action dated Nov. 22, 2019 for U.S. Appl. No. 15/938,791.
European Communication dated Feb. 19, 2020 for EP Application No. 18176224.6.
Final Office Action dated Apr. 15, 2020 for U.S. Appl. No. 15/938,791.
Non-Final Office Action dated Jan. 28, 2019 for U.S. Appl. No. 15/643,289.
1 Non-Final Office Action dated Apr. 23, 2018 for U.S. Appl. No. 15/623,489.
European Search Report dated Dec. 19, 2017 for EP application No. 17191162.1.
Final Office Action dated May 19, 2020 for U.S. Appl. No. 15/787,304.
Extended European Search Report dated Jul. 8, 2019 for European Patent Application No. 19162438.6.
Final Office Action dated Jul. 9, 2019 for U.S. Appl. No. 15/787,304.
Final Office Action dated Jul. 12, 2019 for U.S. Appl. No. 15/643,285.
Extended European Search Report dated Nov. 8, 2018 for EP Application No. 18176224.6.
Non-Final Office Action dated Feb. 18, 2021 for U.S. Appl. No. 15/938,791.
Final Office Action dated Jul. 10, 2020 for U.S. Appl. No. 15/938,787.
European Search Report dated Dec. 19, 2017 for EP application No. 17191168.8.
Final Office Action dated Aug. 22, 2019 for U.S. Appl. No. 15/643,274.
Non-Final Office Action dated May 12, 2021 for U.S. Appl. No. 15/643,274.
Final Office Action dated Jun. 1, 2021 for U.S. Appl. No. 15/643,277.
Non-Final Office Action dated Apr. 27, 2021 for U.S. Appl. No. 15/938,787.
Non-Final Office Action dated Aug. 2, 2021 for U.S. Appl. No. 15/643,282.
Final Office Action dated Apr. 22, 2021 for U.S. Appl. No. 15/643,285.
Final Office Action dated Aug. 13, 2021 for U.S. Appl. No. 15/938,791.
Non-Final Office Action dated Aug. 18, 2021 for U.S. Appl. No. 15/643,285.
Non-Final Office Action dated Aug. 18, 2021 for U.S. Appl. No. 15/787,304.
Final Office Action dated Feb. 24, 2022 for U.S. Appl. No. 15/643,277.
Final Office Action dated Feb. 11, 2022 for U.S. Appl. No. 16/847,032.
Notice of Allowance dated Jun. 23, 2022 for U.S. Appl. No. 16/847,359.
Non-Final Office Action dated Dec. 6, 2021 for U.S. Appl. No. 15/643,279.
Final Office Action dated Dec. 15, 2021 for U.S. Appl. No. 15/787,304.
Japanese Notice of Reasons for Rejection dated Nov. 29, 2022 for JP Application No. 2018-109908.
Final Office Action dated Jun. 3, 2022 for U.S. Appl. No. 15/643,279.
Non-Final Office Action dated Dec. 23, 2022 for U.S. Appl. No. 17/878,348.
Non-Final Office Action dated Sep. 17, 2021 for U.S. Appl. No. 15/643,277.
Non-Final Office Action dated Nov. 14, 2022 for U.S. Appl. No. 15/643,285.
Final Office Action dated Dec. 1, 2022 for U.S. Appl. No. 15/643,277.
Final Office Action dated Feb. 14, 2022 for U.S. Appl. No. 16/847,359.
Non-Final Office Action dated Sep. 15, 2022 for U.S. Appl. No. 16/543,279.
Notice of Allowance dated Apr. 20, 2022 for U.S. Appl. No. 15/643,289.
Japanese Notice of Reasons for Rejection dated May 9, 2022 for Japanese Application No. 2018-109908.
Final Office Action dated Jan. 20, 2022 for U.S. Appl. No. 15/643,285.
Non-Final Office Action dated Sep. 23, 2022 for U.S. Appl. No. 16/991,589.
Final Office Action dated Dec. 28, 2021 for U.S. Appl. No. 15/643,282.
Non-Final Office Action dated Sep. 21, 2022 for U.S. Appl. No. 17/100,823.
European Examination Report dated May 13, 2022 for European Patent Application No. 18176222.0.
Final Office Action dated Dec. 9, 2021 for U.S. Appl. No. 15/938,787.
Non-Final Office Action dated Mar. 14, 2022 for U.S. Appl. No. 15/643,282.

(56) References Cited

OTHER PUBLICATIONS

Non-Final Office Action dated Dec. 22, 2022 for U.S. Appl. No. 15/938,787.
Non-Final Office Action dated Jul. 1, 2022 for U.S. Appl. No. 15/643,277.
Non-Final Office Action dated Sep. 29, 2021 for U.S. Appl. No. 15/643,289.
1 Non-Final Office Action dated Dec. 20, 2022 for U.S. Appl. No. 15/643,282.
Final Office Action dated Aug. 25, 2022 for U.S. Appl. No. 15/643,282.
Final Office Action dated Jun. 15, 2023 for U.S. Appl. No. 15/643,285.
Final Office Action dated Jun. 27, 2023 for U.S. Appl. No. 15/643,282.
Final Office Action dated Jun. 22, 2023 for U.S. Appl. No. 15/938,787.
Final office Action dated Jul. 7, 2023 for U.S. Appl. No. 17/878,348.
Final Office Action dated Feb. 6, 2023 for U.S. Appl. No. 17/100,823.
Non-Final Office Action dated Apr. 19, 2023 for U.S. Appl. No. 15/787,304.
Non-Final Office Action dated Aug. 4, 2023 for U.S. Appl. No. 17/100,823.
Final Office Action dated Apr. 18, 2023 for U.S. Appl. No. 16/991,589.
Non-Final Office Action dated May 11, 2023 for U.S. Appl. No. 15/643,277.
Final Office Action dated Mar. 31, 2023 for U.S. Appl. No. 15/643,279.
Non-Final Office Action dated Sep. 20, 2023 for U.S. Appl. No. 16/991,589.
Non-Final Office Action dated Sep. 13, 2023 for U.S. Appl. No. 15/643,279.
Final Office Action dated Sep. 11, 2023 for U.S. Appl. No. 15/787,304.
Notice of Allowance dated Jan. 24, 2024 for U.S. Appl. No. 16/847,032.
Non-Final Office Action dated May 7, 2024 for U.S. Appl. No. 17/100,823.
Non-Final Office Action dated Feb. 8, 2024 for U.S. Appl. No. 15/938,791.
Non-Final Office Action dated Nov. 9, 2023 for U.S. Appl. No. 15/643,282.
Non-Final Office Action dated Jun. 18, 2024 for U.S. Appl. No. 15/643,279.
Non-Final Office Action dated Oct. 25, 2023 for U.S. Appl. No. 15/643,274.
Non-Final Office Action dated Oct. 26, 2023 for U.S. Appl. No. 17/878,348.
Japanese Preliminary Examination Report dated Dec. 28, 2023 for Japanese Application No. 2018-109908.
Final Office Action dated May 10, 2024 for U.S. Appl. No. 15/787,304.
Non-Final Office Action dated May 14, 2024 for U.S. Appl. No. 15/643,277.
Non-Final Office Action dated Jan. 26, 2024 for U.S. Appl. No. 15/787,304.
Final Office Action dated Oct. 10, 2023 for U.S. Appl. No. 15/938,791.
Final Office Action dated Nov. 15, 2023 for U.S. Appl. No. 15/643,277.
Non-Final Office Action dated Sep. 25, 2023 for U.S. Appl. No. 16/847,032.
Final Office Action dated Mar. 4, 2024 for U.S. Appl. No. 15/643,279.
Final Office Action dated May 23, 2024 for U.S. Appl. No. 15/643,282.
Final Office Action dated Mar. 14, 2024 for U.S. Appl. No. 16/991,589.
Final Office Action dated Apr. 24, 2024 for U.S. Appl. No. 15/643,274.
Final Office Action dated Jan. 9, 2024 for U.S. Appl. No. 17/100,823.

* cited by examiner

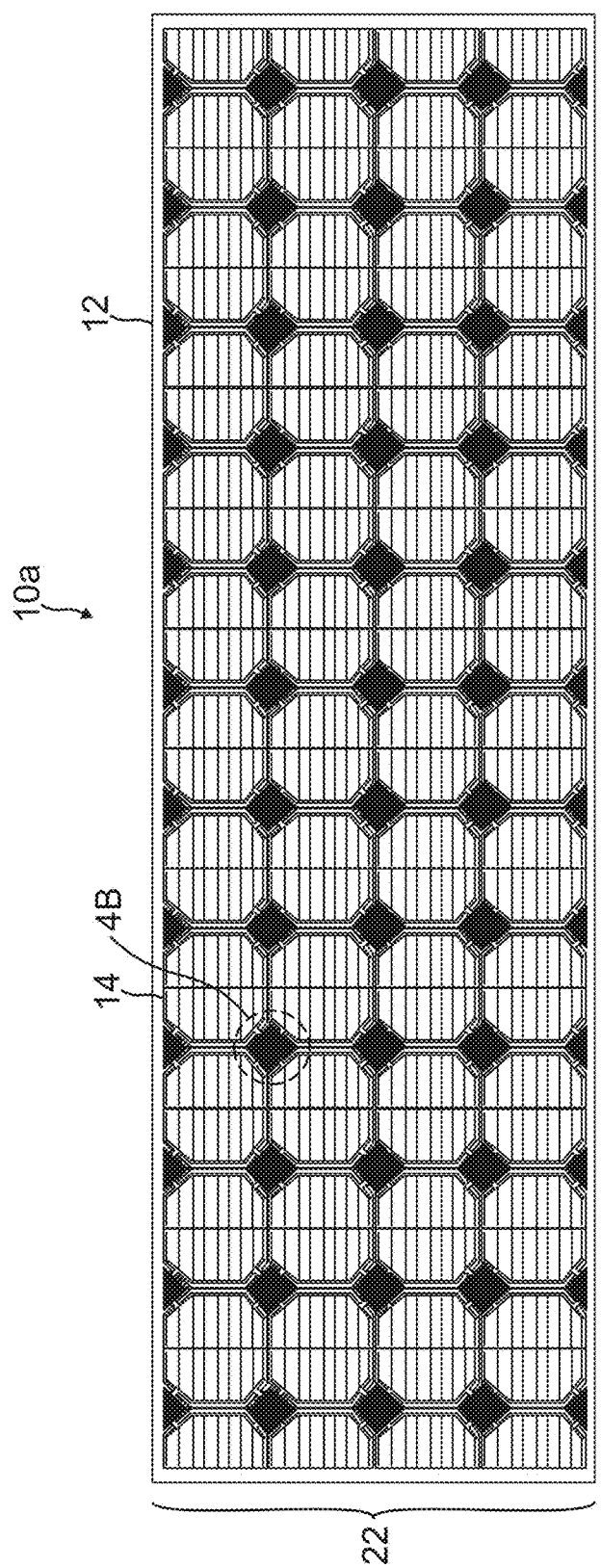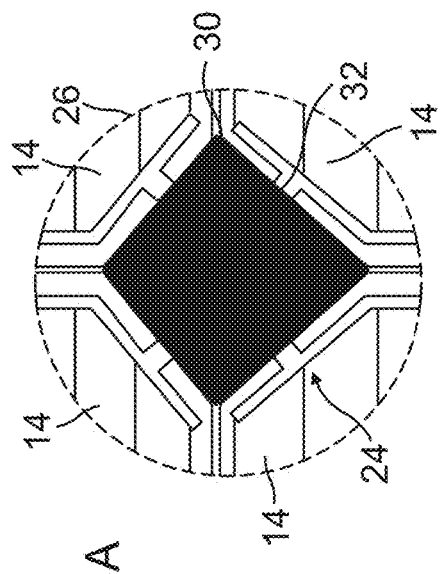
FIG. 4A
FIG. 4B

SOLAR CELL ARRAY WITH CHANGEABLE STRING LENGTH

CROSS REFERENCE TO RELATED APPLICATIONS

This application claims the benefit under 35 U.S.C. Section 119(e) of the following co-pending and commonly-assigned application:

U.S. Provisional Application Ser. No. 62/518,125, filed on Jun. 12, 2017, by Eric Rehder, entitled "SOLAR CELL ARRAY WITH CHANGEABLE STRING LENGTH," (G&C 147.256-US-P1);

which application is incorporated by reference herein.

This application also claims the benefit under 35 U.S.C. Section 119(e) of the following co-pending and commonly-assigned application:

U.S. Provisional Application Ser. No. 62/518,131, filed on Jun. 12, 2017, by Eric Rehder, entitled "SOLAR CELL ARRAY WITH BYPASSED SOLAR CELLS," (G&C 147.257-US-P1);

which application is incorporated by reference herein.

In addition, this application claims the benefit under 35 U.S.C. Section 120 of the following co-pending and commonly-assigned applications:

U.S. Utility application Ser. No. 15/643,274, filed on Jul. 6, 2017, by Eric Rehder, entitled "SOLAR CELL ARRAY CONNECTIONS USING CORNER CONDUCTORS," (G&C 147.211-US-U1);

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY," (G&C 147.213-US-U1);

U.S. Utility application Ser. No. 15/643,279, filed on Jul. 6, 2017, by Eric Rehder, entitled "REWORK AND REPAIR OF COMPONENTS IN A SOLAR ARRAY," (G&C 147.216-US-U1);

U.S. Utility application Ser. No. 15/643,282, filed on Jul. 6, 2017, by Eric Rehder, entitled "POWER ROUTING MODULE FOR A SOLAR ARRAY," (G&C 147.217-US-U1);

U.S. Utility application Ser. No. 15/643,285, filed on Jul. 6, 2017, by Eric Rehder, entitled "POWER ROUTING MODULE WITH A SWITCHING MATRIX FOR A SOLAR CELL ARRAY," (G&C 147.218-US-U1);

U.S. Utility application Ser. No. 15/643,287, filed on Jul. 6, 2017, by Eric Rehder, entitled "NANO-METAL CONNECTIONS FOR A SOLAR CELL ARRAY," (G&C 147.219-US-U1); and U.S. Utility application Ser. No. 15/643,289, filed on Jul. 6, 2017, by Eric Rehder, Philip Chiu, Tom Crocker, Daniel Law and Dale Waterman, entitled "SOLAR CELLS FOR A SOLAR CELL ARRAY,";

all of which applications claim the benefit under 35 U.S.C. Section 119(e) of the following co-pending and commonly-assigned provisional applications:

U.S. Provisional Application Ser. No. 62/394,636, filed on Sep. 14, 2016, by Eric Rehder, entitled "SOLAR CELL ARRAY CONNECTIONS," (G&C 147.211-US-P1);

U.S. Provisional Application Ser. No. 62/394,616, filed on Sep. 14, 2016, by Eric Rehder, entitled "CORNER CONNECTORS FOR A SOLAR CELL ARRAY," (G&C 147.212-US-P1);

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY," (G&C 147.213-US-P1);

U.S. Provisional Application Ser. No. 62/394,627, filed on Sep. 14, 2016, by Eric Rehder, entitled "SELECT CURRENT PATHWAYS IN A SOLAR CELL ARRAY," (G&C 147.214-US-P1);

U.S. Provisional Application Ser. No. 62/394,629, filed on Sep. 14, 2016, by Eric Rehder, entitled "MULTILAYER CONDUCTORS IN A SOLAR CELL ARRAY," (G&C 147.215-US-P1);

U.S. Provisional Application Ser. No. 62/394,632, filed on Sep. 14, 2016, by Eric Rehder, entitled "REWORK AND REPAIR OF COMPONENTS IN A SOLAR CELL ARRAY," (G&C 147.216-US-P1);

U.S. Provisional Application Ser. No. 62/394,649, filed on Sep. 14, 2016, by Eric Rehder, entitled "POWER ROUTING MODULE FOR A SOLAR CELL ARRAY," (G&C 147.217-US-P1);

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY,";

U.S. Provisional Application Ser. No. 62/394,667, filed on Sep. 14, 2016, by Eric Rehder, entitled "NANO-METAL CONNECTIONS FOR A SOLAR CELL ARRAY," (G&C 147.219-US-P1);

U.S. Provisional Application Ser. No. 62/394,671, filed on Sep. 14, 2016, by Eric Rehder, entitled "BACK CONTACTS FOR A SOLAR CELL ARRAY," (G&C 147.220-US-P1);

U.S. Provisional Application Ser. No. 62/394,641, filed on Sep. 14, 2016, by Eric Rehder, entitled "PRINTED CONDUCTORS IN A SOLAR CELL ARRAY," (G&C 147.228-US-P1); and U.S. Provisional Application Ser. No. 62/394,672, filed on Sep. 14, 2016, by Eric Rehder, Philip Chiu, Tom Crocker and Daniel Law, entitled "SOLAR CELLS FOR A SOLAR CELL ARRAY," (G&C 147.229-US-P1);

all of which applications are incorporated by reference herein.

This application also claims the benefit under 35 U.S.C. Section 120 of the following co-pending and commonly-assigned applications:

U.S. Utility application Ser. No. 15/787,304, filed on Oct. 18, 2017, by Eric Rehder, entitled "SOLAR CELL ARRAY WITH BYPASSED SOLAR CELLS," (G&C 147.257-US-U1), which application claims the benefit under 35 U.S.C. Section 119(e) of the co-pending and commonly-assigned provisional application 62/518,131 listed above, which application is incorporated by reference herein.

STATEMENT REGARDING FEDERALLY SPONSORED RESEARCH OR DEVELOPMENT

This invention was made with government support under Contract No. FA9453-09-C-0373 awarded by the United States Air Force. The government has certain rights in this invention.

BACKGROUND INFORMATION

1. Field

The disclosure is related generally to solar cell panels and more specifically to a solar cell array with changeable string length.

2. Background

A typical spaceflight-capable solar cell panel assembly involves building solar cell arrays comprised of long strings of solar cells. These strings are variable in length, i.e., number of solar cells, and can be very long.

Conventional solar cell arrays are built with a fixed number of solar cells to produce a required output voltage. The fixed number of solar cells must be sized under the most difficult conditions, which is the hottest period of operation with the highest dosage of electron and proton radiation. Specifically, existing solutions produce strings sized for worst case environments.

For a 100V operation, this may be ~55 solar cells. At the beginning of the solar cell array's operation, the radiation damage is minimal and the 100V can be achieved with ~45 solar cells. Thus, at the beginning of operation, roughly 18% ($10/55$) of the solar cells are not producing usable power.

This will change with operating temperature and with the accumulated dose of high energy electrons and protons in the space environment. Of primary concern is the changing voltage during the lifespan of the solar cell array.

What is needed, then, is a means for accommodating the changes to the solar cell array's operation during its lifespan.

SUMMARY

To overcome the limitations described above, and to overcome other limitations that will become apparent upon reading and understanding the present specification, the present disclosure describes a solar cell array comprised of one or more solar cells attached to a substrate, wherein: the substrate includes one or more electrical connections to the solar cells; and the substrate includes one or more switches for changing a string length for one or more of the solar cells by altering a current flow path between the one or more of the solar cells and one or more of the electrical connections.

An area of the substrate remains exposed when at least one of the solar cells having one or more cropped corners is attached to the substrate; and the area of the substrate that remains exposed includes at least one of the switches. The at least one of the solar cells are attached to the substrate such that a corner region defined by the cropped corners of adjacent ones of the at least one of the solar cells are aligned, thereby exposing the area of the substrate. The at least one of the switches is located in the corner region defined by the cropped corners adjacent to the at least one of the solar cells.

The switches change the string length for the one or more of the solar cells in response to a control signal, wherein the switches change the string length to allow for reconfigurability of series connections and outputs between multiple strings. The switches are single-pole single-throw (SPST) switches or dual-pole single-throw (DPST) switches.

The substrate includes one or more traces connected to switches for making the electrical connections between the solar cells.

DRAWINGS

Referring now to the drawings in which like reference numbers represent corresponding parts throughout:

FIGS. 4A and 4B illustrate an alternative structure for the solar cell panel, according to one example.

Figure 18:
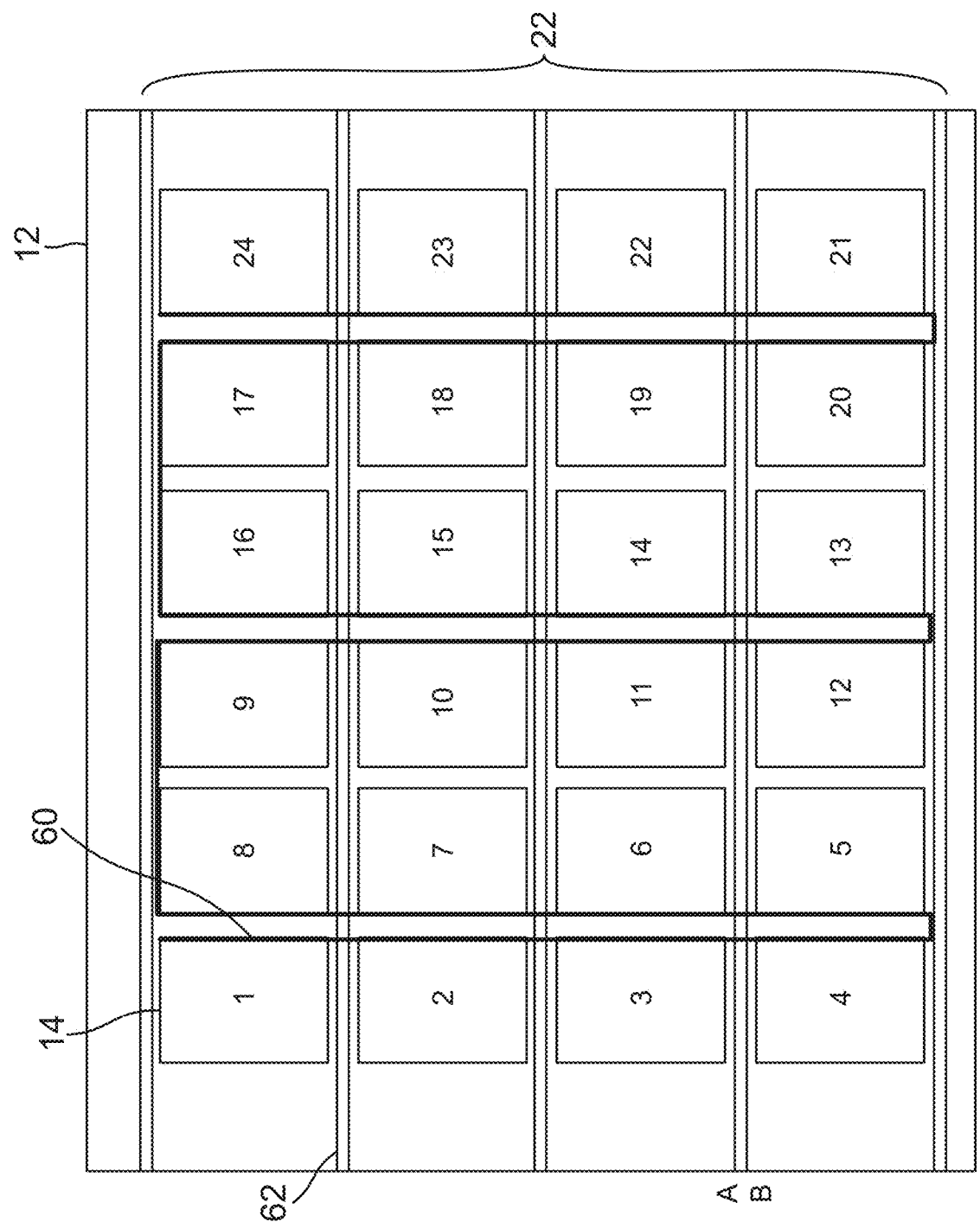

FIG. 18 demonstrates the switching of solar cells to change string length.

Figure 19:
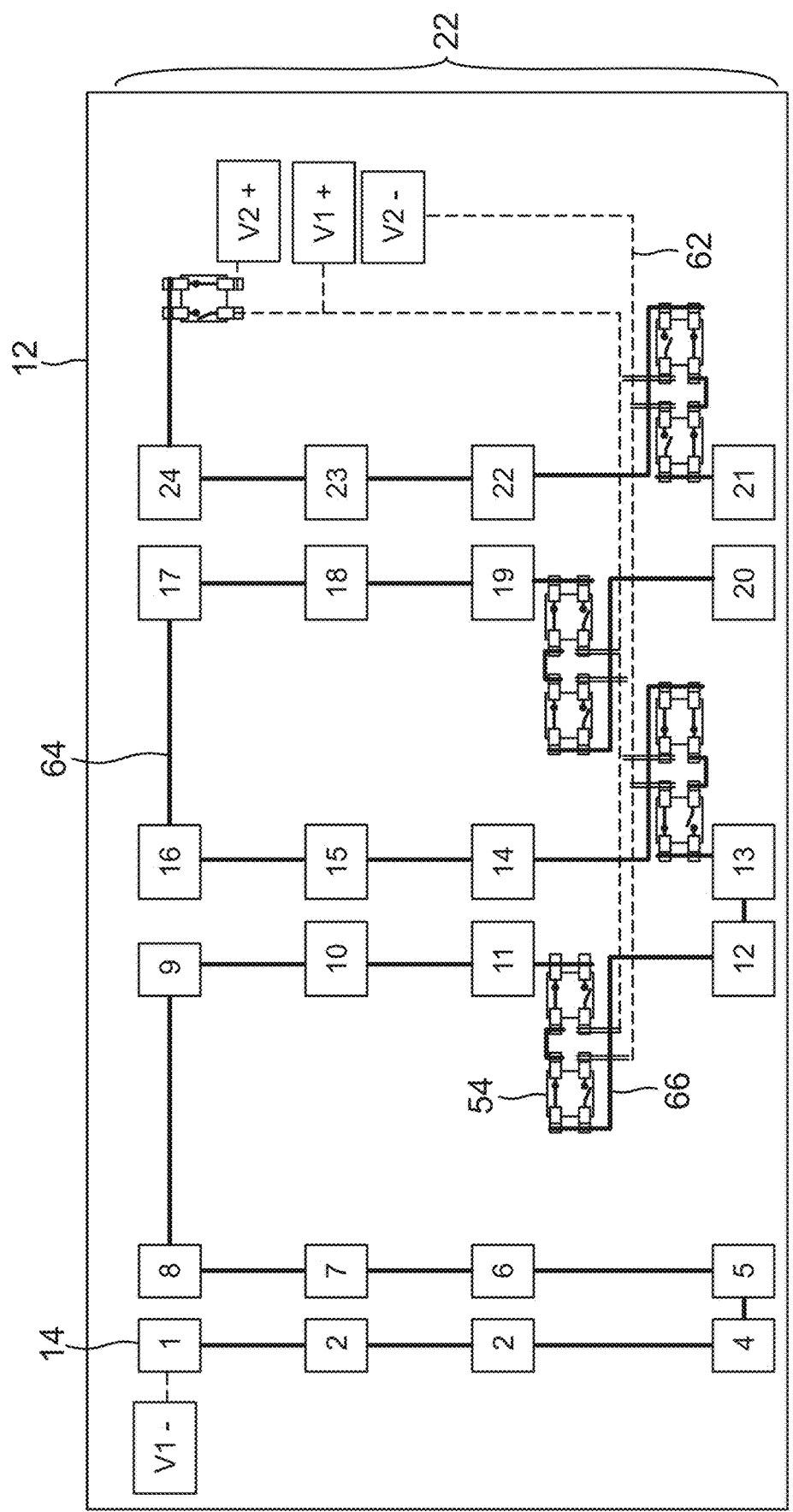

FIG. 19 illustrates a reconfigurable array of solar cells.

Figure 20A:
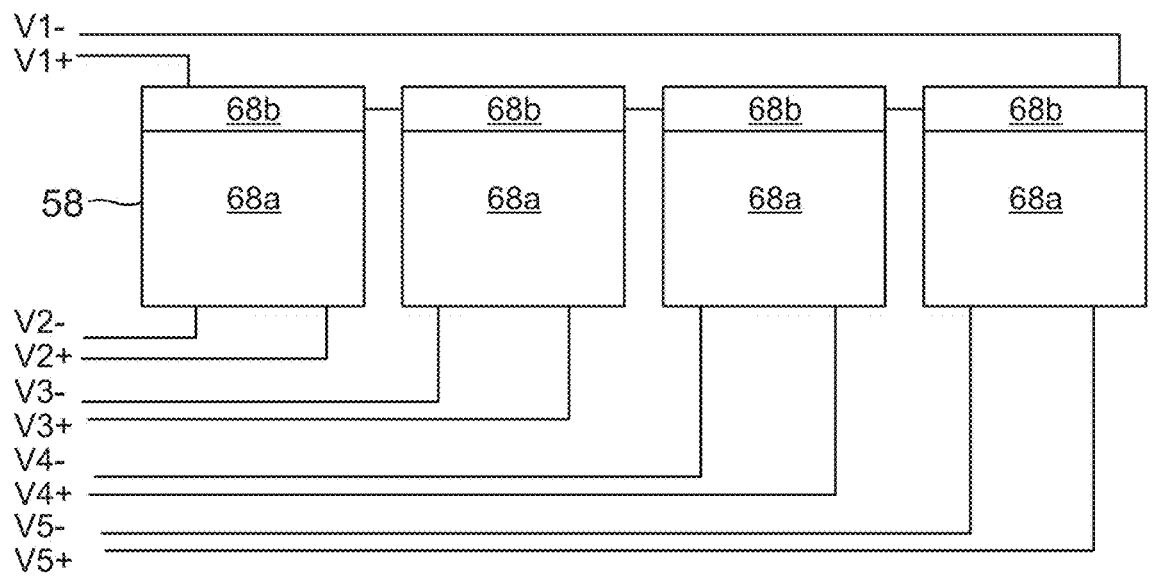
Figure 20B:
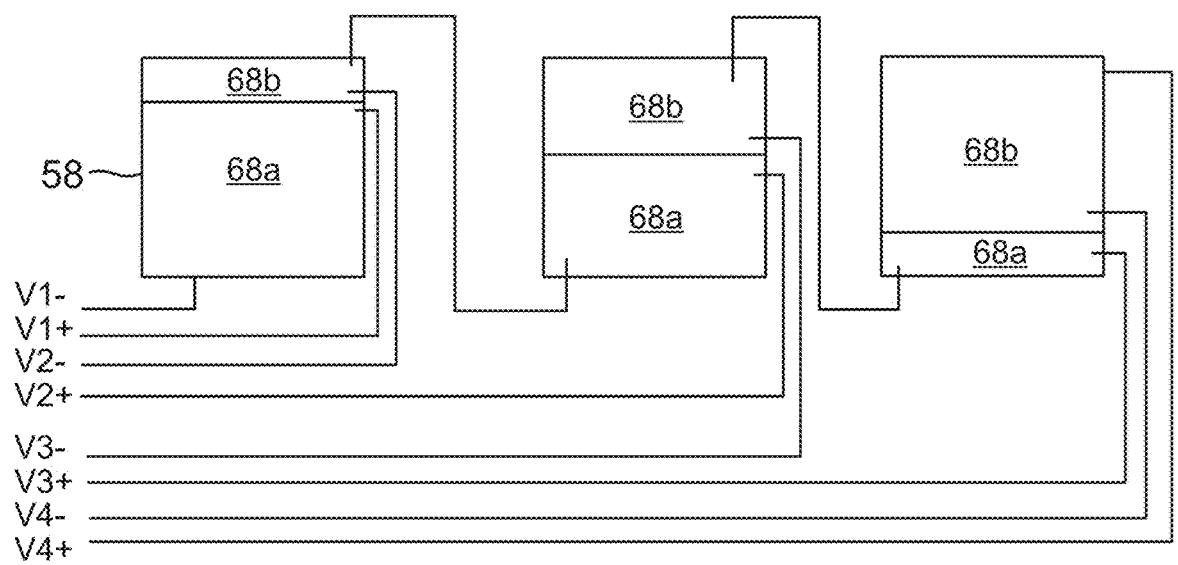

FIG. 20A illustrates how multiple partial strings are connected together to provide a needed string length and output voltage, and FIG. 20B groups of solar cells, each split into two sections, wherein one section from each group of solar cells is connected together to provide a needed string length.

Figure 21:
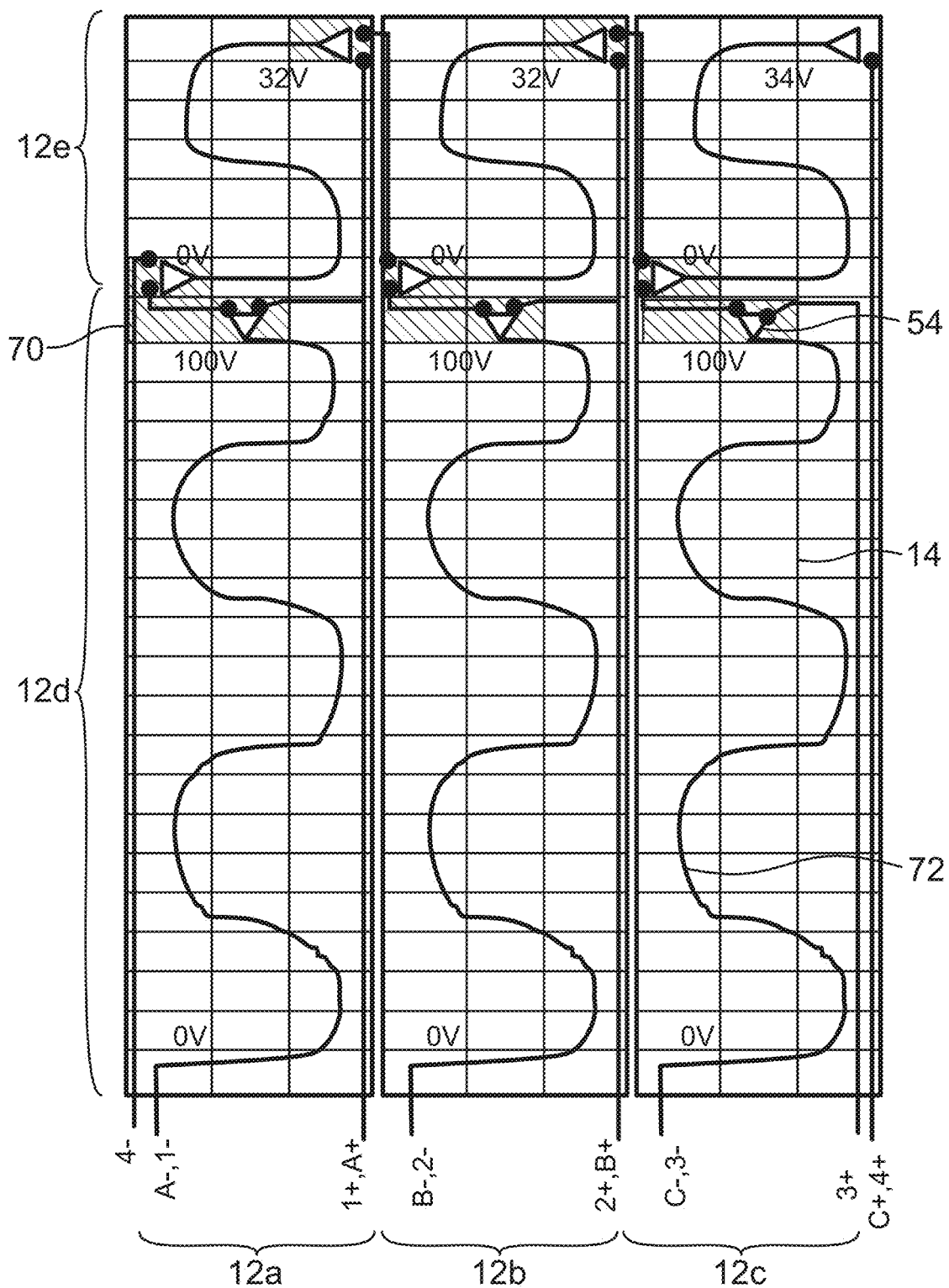

FIG. 21 shows a layout of reconfigurable solar cells comprised of three flex sheets, each with two sections.

Figure 22:
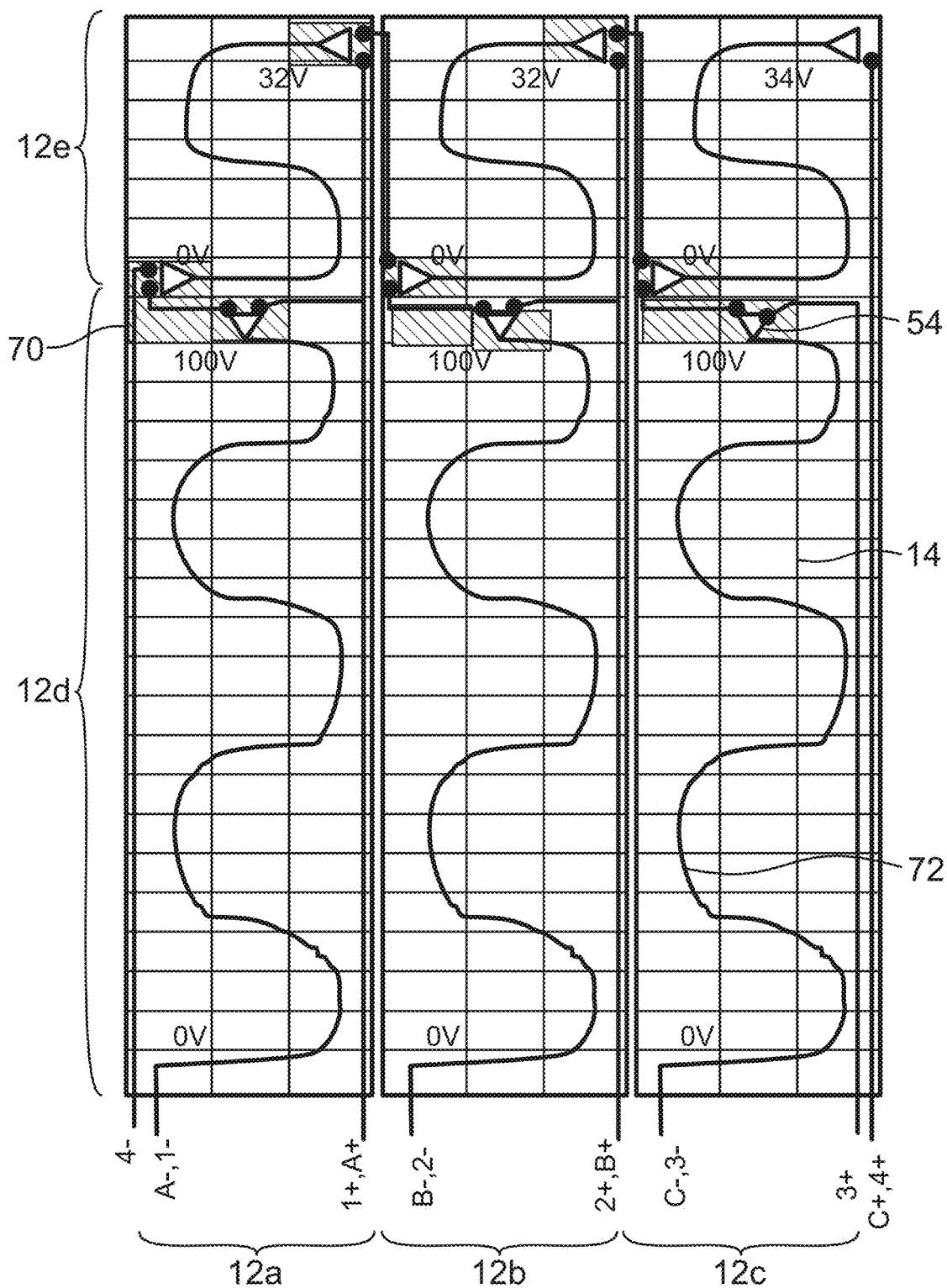

FIG. 22 illustrates how switches can be used to reconfigure the solar cells of FIG. 21.

Figure 23:
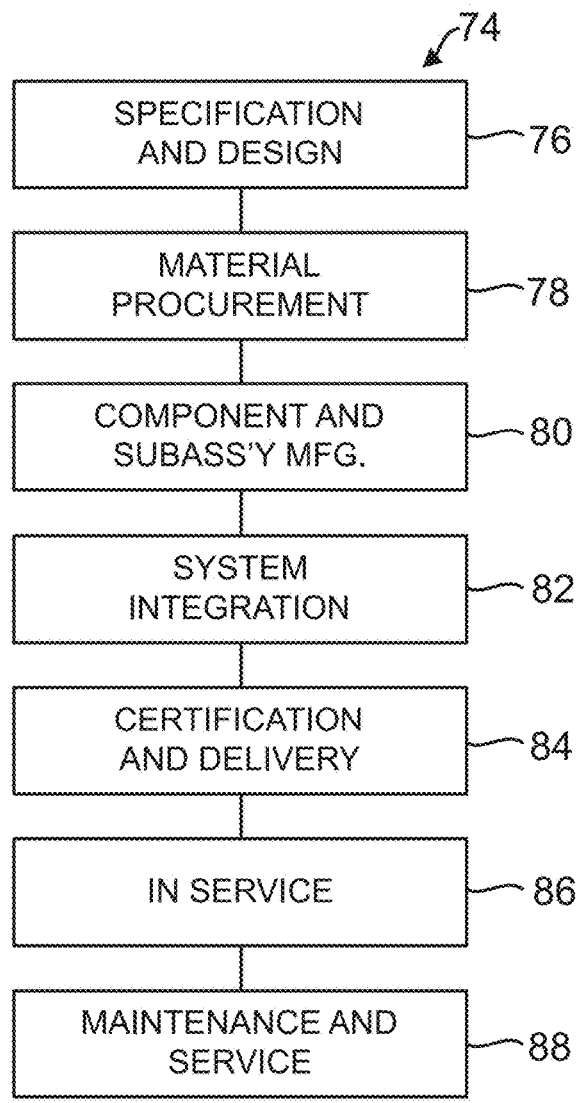

FIG. 23 describes a method of fabricating a solar cell, solar cell panel and/or satellite, according to one example.

Figure 24:
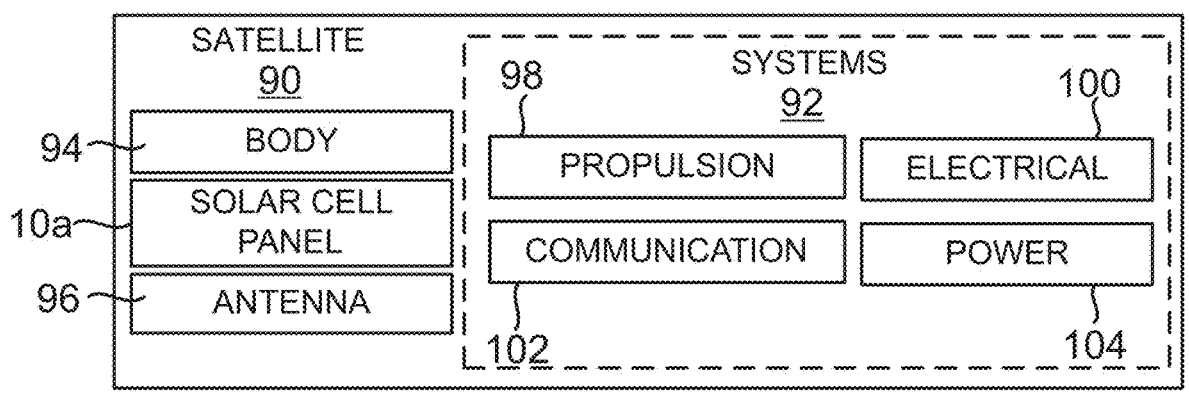

FIG. 24 illustrates a resulting satellite having a solar cell panel comprised of solar cells, according to one example.

Figure 25:
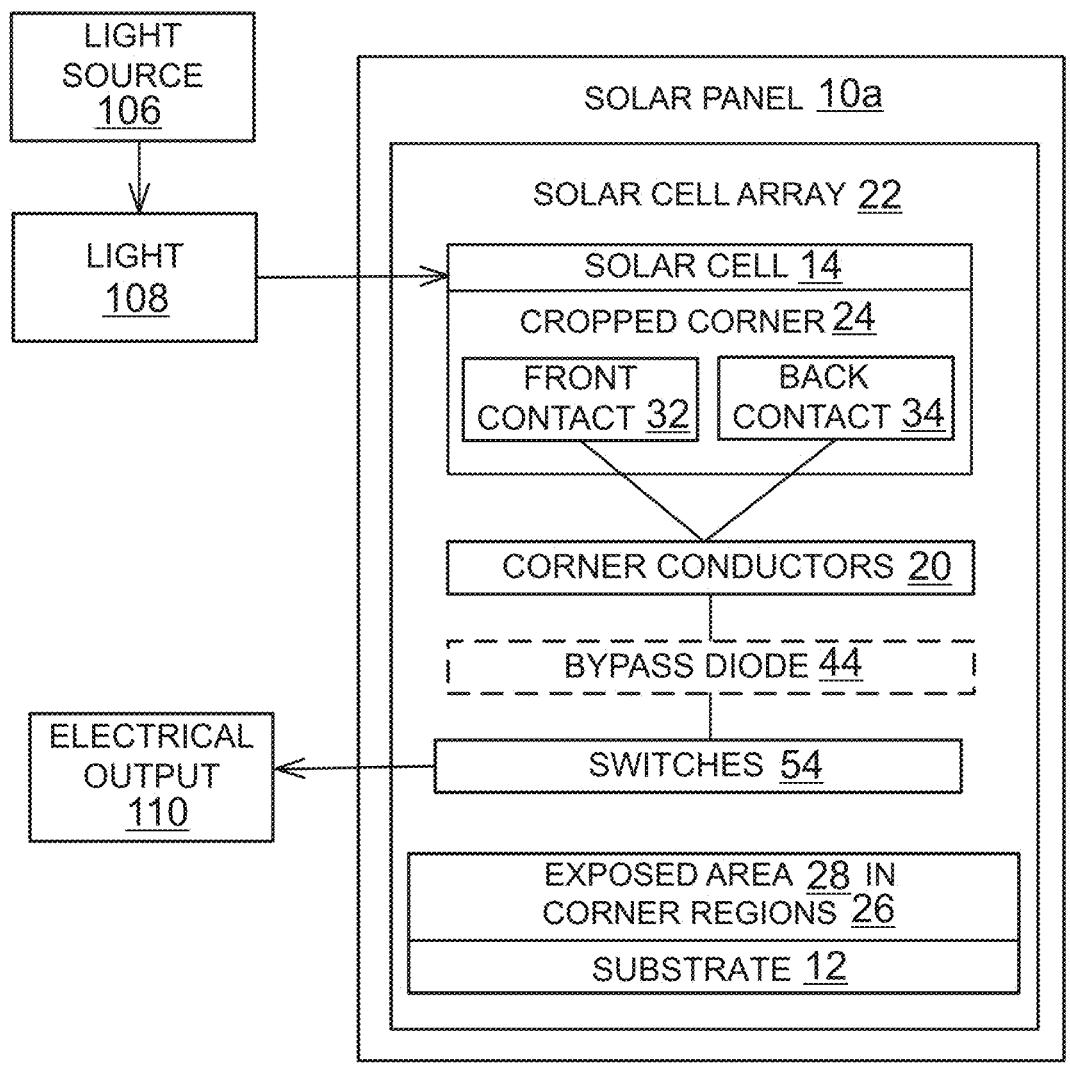

FIG. 25 is an illustration of the solar cell panel in the form of a functional block diagram, according to one example.

FIGS. 26A, 26B, 26C, 26D and 26E illustrate experimental results, where a solar cell array based on the corner conductor design and using a flex circuit substrate was built to demonstrate the reconfiguration of the string length of the array.

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

General Description

A new approach to the design of solar cell arrays, such as those used for spaceflight power applications, is based on electrical connections among the solar cells in the array.

This new approach rearranges the components of a solar cell and the arrangements of the solar cells in the array. Instead of having solar cells connected into long linear strings and then assembled onto a substrate, the solar cells are attached individually to a substrate, such that corner regions of adjacent cells are aligned on the substrate, thereby exposing an area of the substrate. Electrical connections between cells are made by corner conductors formed on or in the substrate in these corner regions. Consequently, this approach presents a solar cell array design based on individual cells.

Thus, a single laydown process and layout can be used in the fabrication of solar cell arrays. Current flow between solar cells will be assisted with conductors embedded in the substrate. These electrical connections define the specific characteristics of the solar cell array, such as its dimensions, stayout zones, and circuit terminations. This approach simplifies manufacturing, enables automation, and reduces costs and delivery times.

Figure 1:
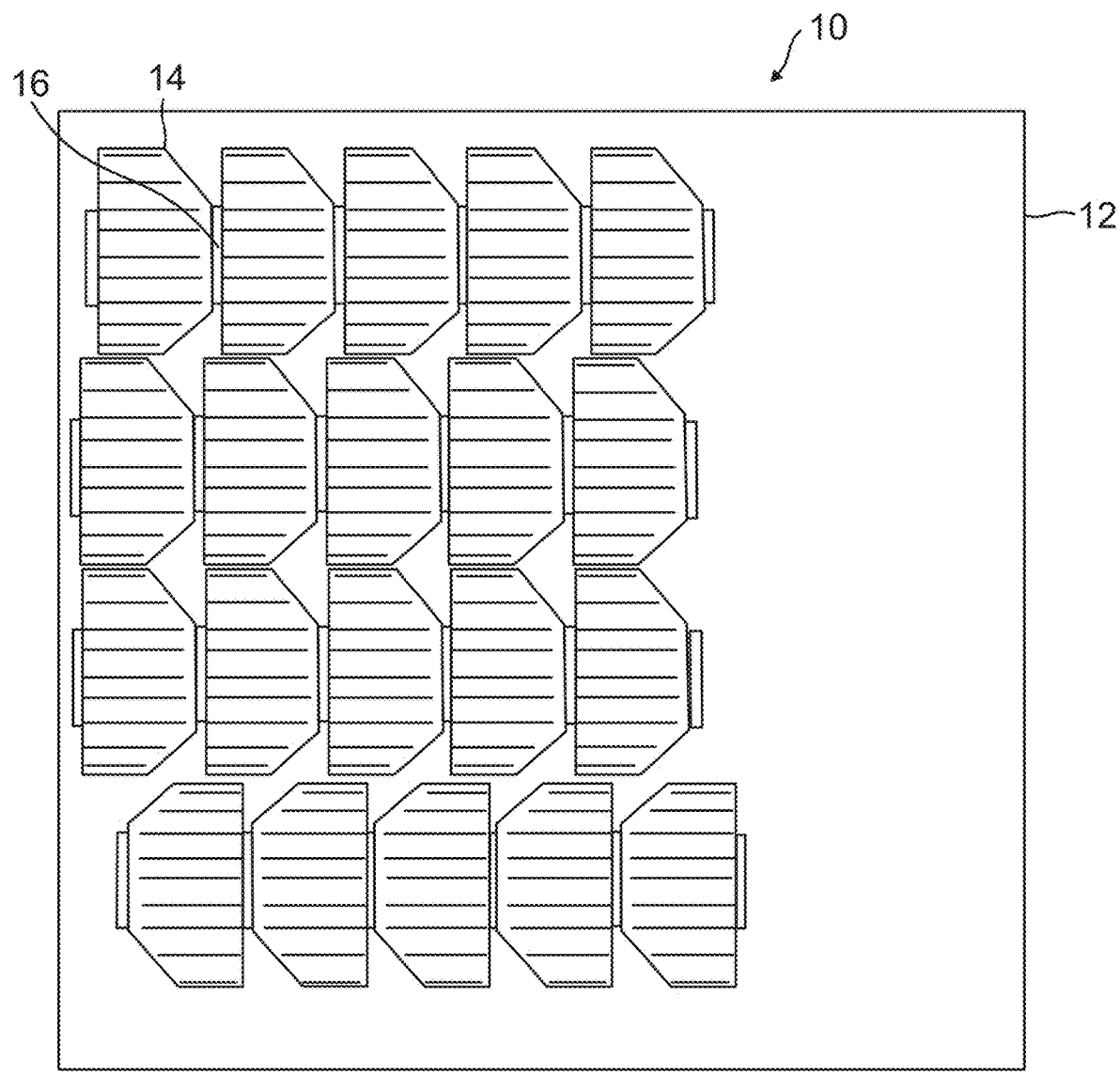
FIGS. 1 and 2 illustrate conventional structures for solar cell panels.
Figure 2:
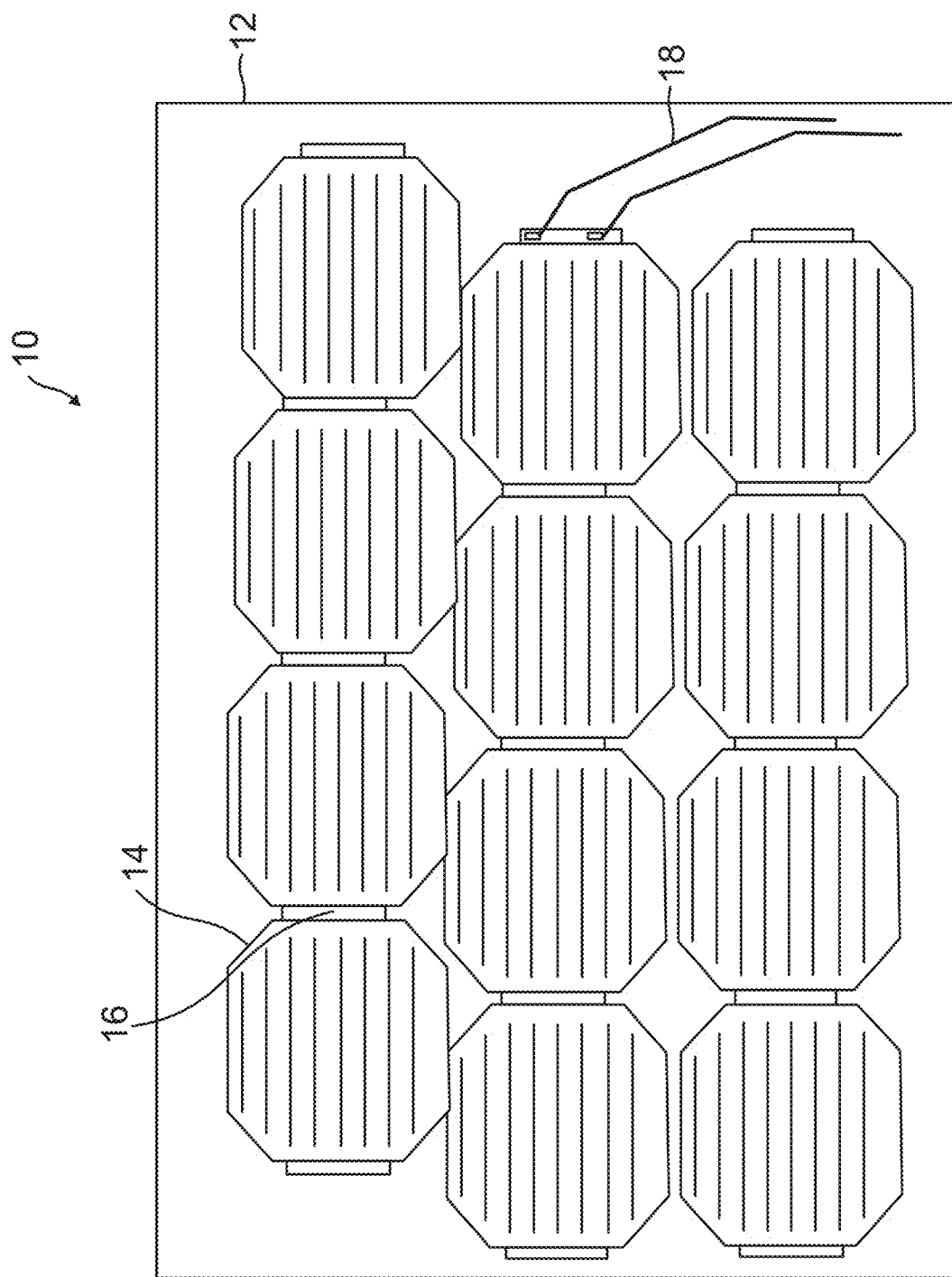

FIGS. 1 and 2 illustrate conventional structures for solar cell panels 10, which include a substrate 12, a plurality of solar cells 14 arranged in an array, and electrical connectors 16 between the solar cells 14. Half size solar cells 14 are shown in FIG. 1 and full size solar cells 14 are shown in FIG. 2. Space solar cells 14 are derived from a round Germanium (Ge) substrate starting material, which is later fabricated into semi-rectangular shapes to improve dense packing onto the solar cell panel 10. This wafer is often diced into one or two solar cells 14 herein described as half size or full size solar cells 14. The electrical connectors 16 providing electrical connections between solar cells 14 are made along the long parallel edge between solar cells 14. These series connections (cell-to-cell) are completed off-substrate, as strings of connected solar cells 14 are built having lengths of any number of solar cells 14. The completed strings of solar cells 14 are then applied and attached to the substrate 12.

In FIG. 2, wiring 18 is attached at the end of a string of solar cells 14 to electrically connect the string to other strings, or to terminate the resulting circuit and bring the current off of the array of solar cells 14. String-to-string and circuit termination connections are typically done on the substrate 12, and typically using wiring 18. However, some solar cell panels 10 use a printed circuit board (PCB)-type material with embedded conductors.

Adjacent strings of connected solar cells 14 can run parallel or anti-parallel. In addition, strings of connected solar cells 14 can be aligned or misaligned. There are many competing influences to the solar cell 14 layout resulting in regions where solar cells 14 are parallel or anti-parallel, aligned or misaligned.

Figure 3A:
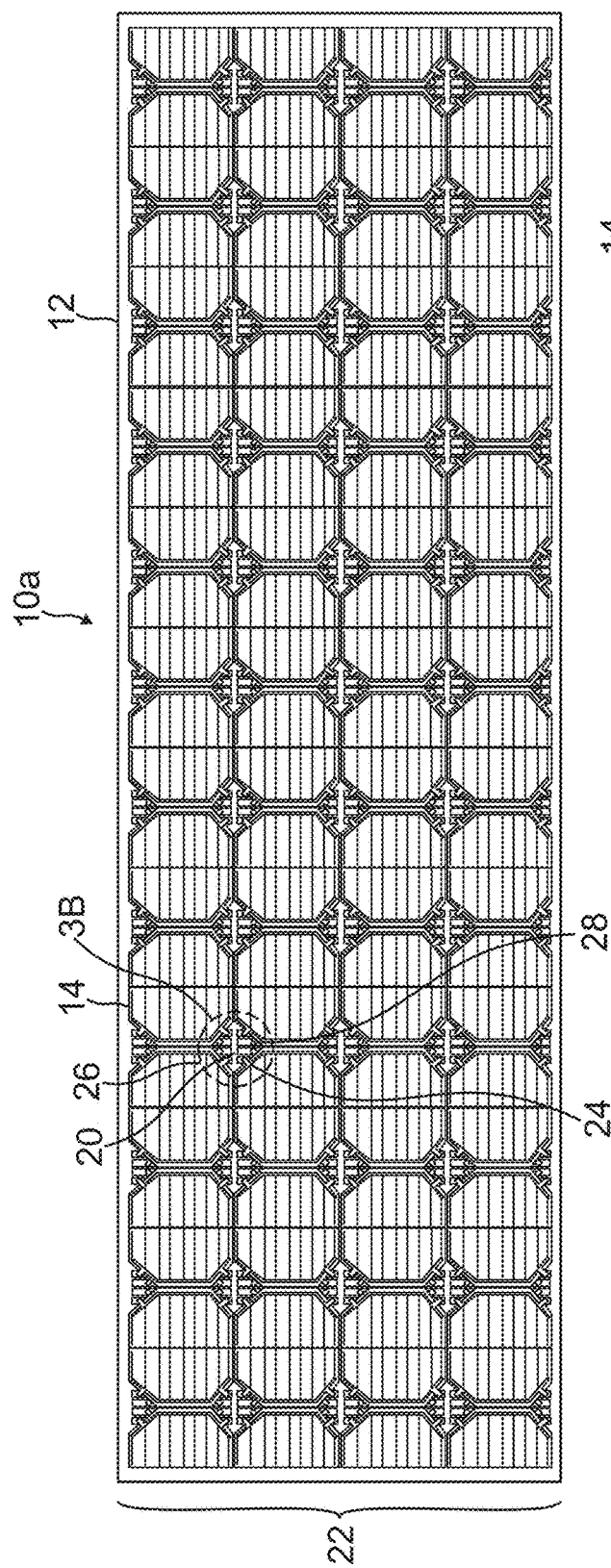
FIGS. 3A and 3B illustrate an improved structure for a solar cell panel, according to one example.
Figure 3B:
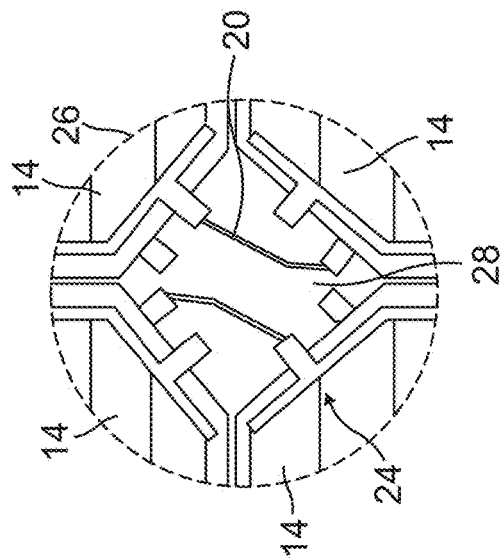

FIGS. 3A and 3B illustrate improved devices and structures for a solar cell panel 10a, according to one example, wherein FIG. 3B is an enlarged view of the details in the dashed circle in FIG. 3A. The various components of the solar cell panel 10a are shown and described in greater detail in FIGS. 5-13.

The solar cell panel 10a includes a substrate 12 for solar cells 14 having one or more corner conductors 20 thereon.

In one example, the substrate 12 is a multi-layer substrate 12 comprised of one or more Kapton® (polyimide) insulating layers separating one or more patterned metal layers. The substrate 12 may be mounted on a large rigid panel 10a similar to conventional assembles. Alternatively, the substrate 12 can be mounted to a lighter, more sparse frame or panel 10a for mounting or deployment.

A plurality of solar cells 14 are attached to the substrate 12 in a two-dimensional (2-D) grid of an array 22. In this example, the array 22 is comprised of ninety-six (96) solar cells 14 arranged in four (4) rows by twenty-four (24) columns, but it is recognized that any number of solar cells 14 may be used in different implementations.

The solar cells 14 have cropped corners 24 that define corner regions 26, as indicated by the dashed circle. The solar cells 14 are attached to the substrate 12, such that corner regions 26 of adjacent ones of the solar cells 14 are aligned, thereby exposing an area 28 of the substrate 12. The area 28 of the substrate 12 that is exposed includes one or more of the corner conductors 20, and one or more electrical connections between the solar cells 14 and the corner conductors 20 are made in the corner regions 26 resulting from the cropped corners 24 of the solar cells 14.

In this example, the corner conductors 20 are conductive paths attached to, printed on, buried in, or deposited on the substrate 12, before and/or after the solar cells 14 are attached to the substrate 12, which facilitate connections between adjacent solar cells 14. The connections between the solar cells 14 and the corner conductors 20 are made after the solar cells 14 have been attached to the substrate 12.

In one example, four adjacent solar cells 14 are aligned on the substrate 12, such that four cropped corners 24, one from each solar cell 14, are brought together at the corner regions 26. The solar cells 14 are then individually attached to the substrate 12, wherein the solar cells 14 are placed on top of the corner conductors 20 to make the electrical connection between the solar cells 14 and the corner conductors 20.

The solar cells 14 may be applied to the substrate 12 as CIC (cell, interconnect and coverglass) units. Alternatively, bare solar cells 14 may be assembled on the substrate 12, and then interconnects applied to the solar cells 14, followed by the application of a single solar cell 14 coverglass, multiple solar cell 14 coverglass, multiple cell polymer coversheet, or spray encapsulation. This assembly protects the solar cells 14 from damage that would limit performance.

FIGS. 4A and 4B illustrate an alternative structure for the solar cell panel 10a, according to one example, wherein FIG. 4B is an enlarged view of the details in the dashed circle in FIG. 4A. In this example, only a few corner conductors 20 are printed on or integrated with the substrate 12. Instead, most of the corner conductors 20 are contained within a power routing module (PRM) 30 that is attached to the substrate 12.

Figure 5:
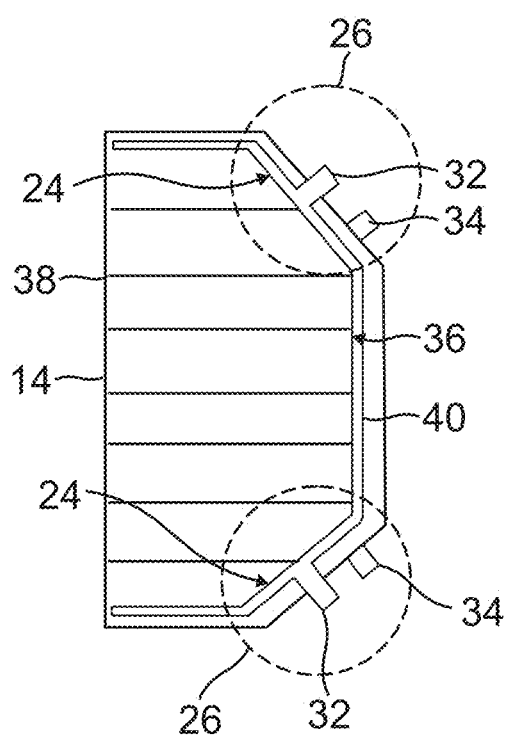
FIG. 5 illustrates the front side of an exemplary solar cell that may be used in the improved solar cell panel of FIGS. 3A-3B and 4A-4B.

FIG. 5 illustrates the front side of an exemplary solar cell 14 that may be used in the improved solar cell panel 10a of FIGS. 3A-3B and 4A-4B. The solar cell 14, which is a CIC unit, is a half-size solar cell 14. (Full-size solar cells 14 could also be used.)

The solar cell 14 is fabricated having at least one cropped corner 24 that defines a corner region 26, as indicated by the dashed circle, such that the corner region 26 resulting from the cropped corner 24 includes at least one contact 32, 34 for making an electrical connection to the solar cell 14. In the example of FIG. 5, the solar cell 14 has two cropped corners 24, each of which has both a front contact 32 on the front side of the solar cell 14 and a back contact 34 on a back side of the solar cell 14, where the contacts 32 and 34 extend into the corner region 26. (Full-size solar cells 14 would have four cropped corners 24, each of which would have a front contact 32 and a back contact 34.)

The cropped corners 24 increase utilization of the round wafer starting materials for the solar cells 14. In conventional panels 10, these cropped corners 24 would result in unused space on the panel 10 after the solar cells 14 are attached to the substrate 12. The new approach described in this disclosure, however, utilizes this unused space. Specifically, metal foil interconnects, comprising the corner conductors 20, front contacts 32 and back contacts 34, are moved to the corner regions 26. In contrast, existing CICs have interconnects attached to the solar cell 14 front side, and connect to the back side (where connections occur) during stringing.

The current generated by the solar cell 14 is collected on the front side of the solar cell 14 by a grid 36 of thin metal fingers 38 and wider metal bus bars 40 that are connected to both of the front contacts 32. There is a balance between the addition of metal in grid 36, which reduces the light entering the solar cell 14 and its output power, and the reduced resistance of having more metal. The bus bar 40 is a low resistance conductor that carries high currents and also provides redundancy should a front contact 32 become disconnected. Optimization generally desires a short bus bar 40 running directly between the front contacts 32. Having the front contact 32 in the cropped corner 24 results in moving the bus bar 40 away from the perimeter of the solar cell 14. This is achieved while simultaneously minimizing the bus bar 40 length and light obscuration. Additionally, the fingers 38 are now shorter. This reduces parasitic resistances in the grid 36, because the length of the fingers 38 is shorter and the total current carried is less. This produces a design where the front contacts 32 and connecting bus bar 40 is moved to provide shorter narrow fingers 38.

Figure 6:
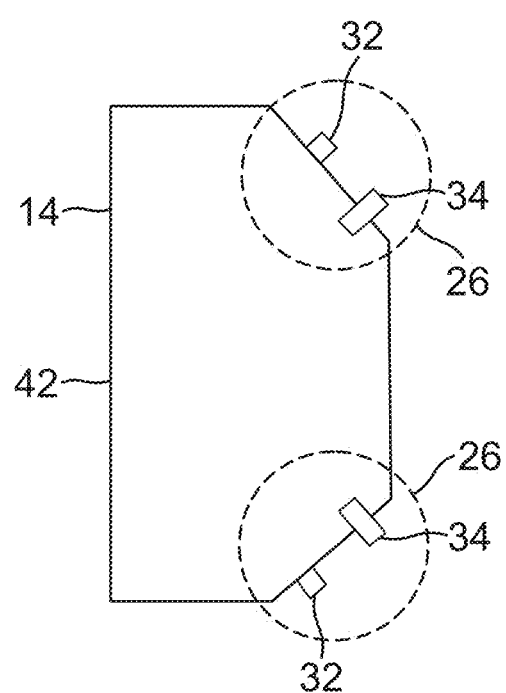
FIG. 6 illustrates the back side of the exemplary solar cell of FIG. 5.

FIG. 6 illustrates the back side of the exemplary solar cell 14 of FIG. 5. The back side of the solar cell 14 has a metal back layer 42 that is connected to both of the back contacts 34.

Figure 7:
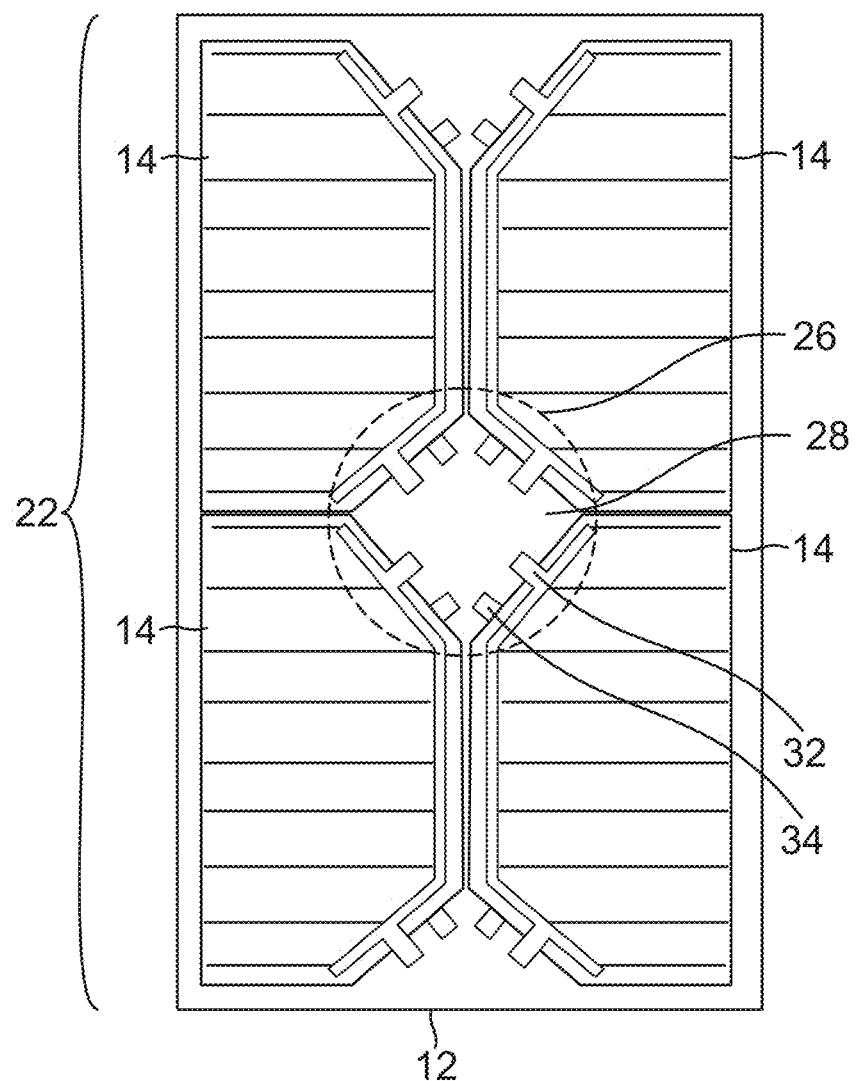
FIG. 7 illustrates cells arranged into the two-dimensional (2D) grid of the array, according to one example.

FIG. 7 illustrates solar cells 14 arranged into the 2D grid of the array 22, according to one example. The array 22 comprises a plurality of solar cells 14 attached to a substrate 12, such that corner regions 26 of adjacent ones of the solar cells 14 are aligned, thereby exposing an area 28 of the substrate 12. Electrical connections (not shown) between the solar cells 14 are made in the exposed area 28 of the substrate 12 using the front contacts 32 and back contacts 34 of the solar cells 14 and corner conductors 20 (not shown) formed on or in the exposed area 28 of the substrate 12.

During assembly, the solar cells 14 are individually attached to the substrate 12. This assembly can be done directly on a support surface, i.e., the substrate 12, which can be either rigid or flexible. Alternatively, the solar cells 14 could be assembled into the 2D grid of the array 22 on a temporary support surface and then transferred to a final support surface, i.e., the substrate 12.

Figure 8:
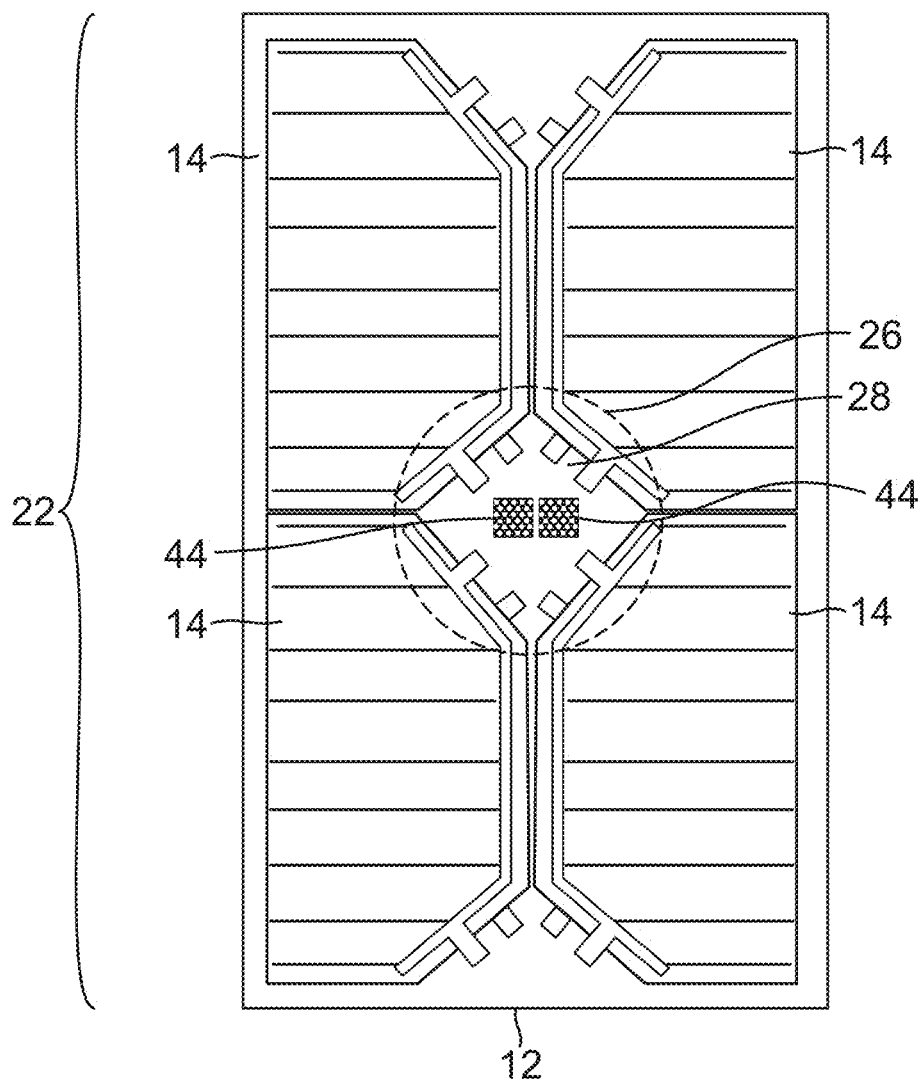
FIG. 8 illustrates an example of the array where one or more bypass diodes are added to the exposed area of the substrate in the corner regions.

FIG. 8 illustrates an example of the array 22 where one or more bypass diodes 44 are added to the exposed area 28 of the substrate 12 in the corner regions 26, for use in one or more of the electrical connections. The bypass diodes 44 protect the solar cells 14 when the solar cells 14 become unable to generate current, which could be due to being partially shadowed, which drives the solar cells 14 into reverse bias. In one example, the bypass diodes 44 are attached to the substrate 12 in the corner regions 26 independent of the solar cells 14.

Figure 9:
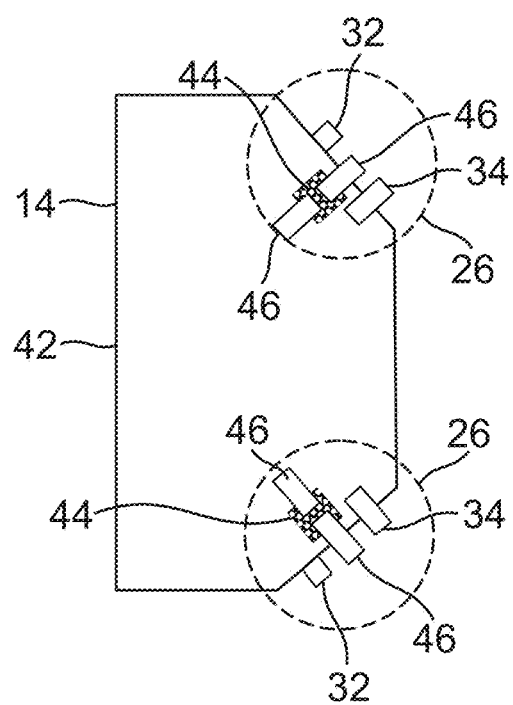
FIG. 9 illustrates an example where the bypass diode is applied to the back side of the cell, with an interconnect or contact for the bypass diode extending into the corner region between front and back contacts.

FIG. 9 illustrates an example where the bypass diode 44 is applied to the back side of the solar cell 14, with interconnects or contacts 46 for the bypass diode 44 connected to the back layer 42 and also extending into the corner region 26 between the front and back contacts 32, 34.

Figure 10:
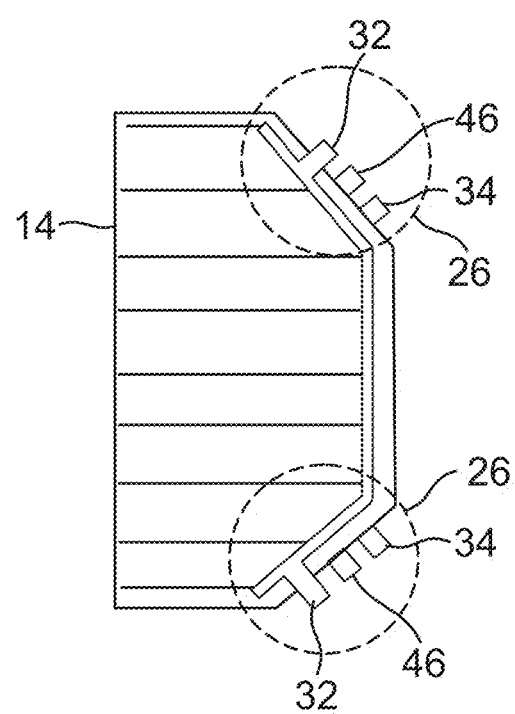
FIG. 10 illustrates a front side view of the example of FIG. 9, with the interconnect or contact for the bypass diode extending into the corner region between the front and back contacts.

FIG. 10 illustrates a front side view of the example of FIG. 9, with the interconnect or contact 46 for the bypass diode 44 (not shown) extending into the corner region 26 between the front and back contacts 32, 34.

Figure 11:
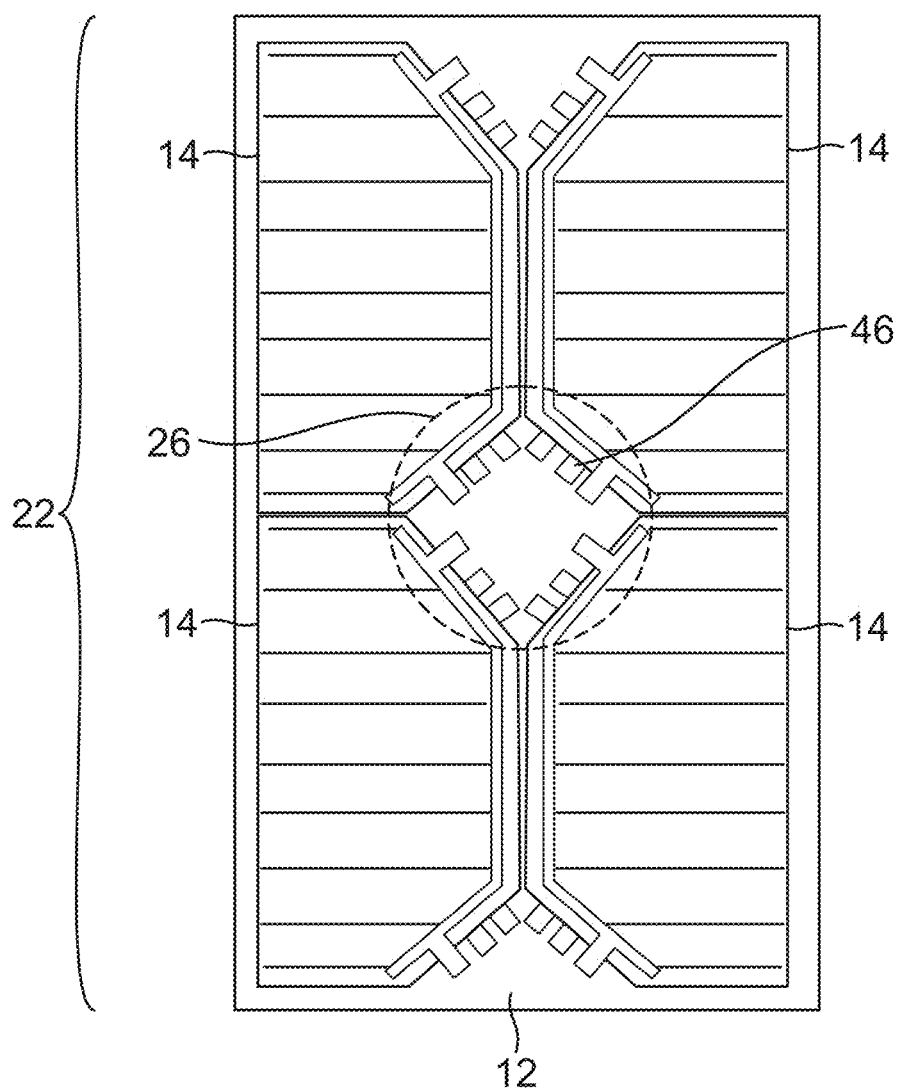
FIG. 11 illustrates the cells of FIGS. 9 and 10 arranged into the 2D grid of the array and applied to the substrate, where the bypass diodes are applied to the back side of the cells, with the contacts for the bypass diodes extending into the corner regions of the cells.

FIG. 11 illustrates the solar cells 14 of FIGS. 9 and 10 arranged into the 2D grid of the array 22 and applied to the substrate 12, where the bypass diodes 44 (not shown) are applied to the back side of the solar cells 14, with the contacts 46 for the bypass diodes 44 extending into the corner regions 26 of the solar cells 14.

One advantage of this approach is that the layouts illustrated in FIGS. 7, 8 and 11 are generalized layouts. Specifically, these layouts can be repeated across any panel 10*a* dimensions desired by a customer. This greatly simplifies assembly, rework, test, and inspection processes.

The placement of the solar cell 14 and bypass diode 44 is generic. The electrical connection of the solar cells 14 into series connections and string terminations is important customization for the end customer and is done independent of the layout. The front contacts 32 and back contacts 34 in the corner regions 26 of the solar cells 14 must be connected. This can be done in many combinations in order to route current through a desired path.

Connections are made between the solar cells 14 and the corner conductors 20. Front and back contacts 32, 34 of the solar cells 14 are present in each corner region 26 for attachment to the corner conductors 20. Interconnects for the front and back contacts 32, 34 of each of the solar cells 14 are welded, soldered, or otherwise bonded onto the corner conductors 20 to provide a conductive path 20, 32, 34 for routing current out of the solar cells 14.

Using the corner conductors 20, any customization can be made in the electrical connections. Adjacent solar cells 14 can be electrically connected to flow current in up/down or left/right directions as desired by the specific design. Current flow can also be routed around stay-out zones as needed. The length or width of the solar cell array 22 can be set as desired. Also, the width can vary over the length of the array 22.

Figure 12:
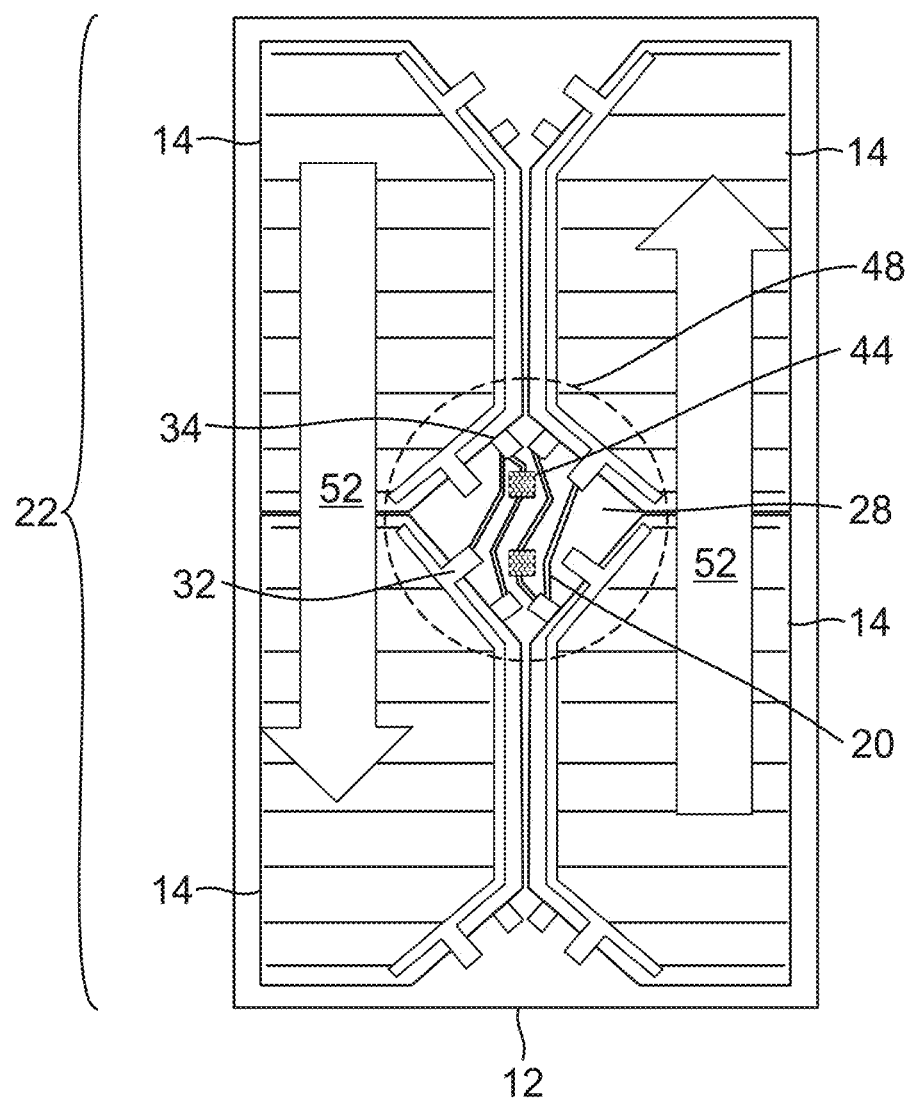
FIG. 12 shows up/down series connections between the cells of the array, according to one example.
Figure 13:
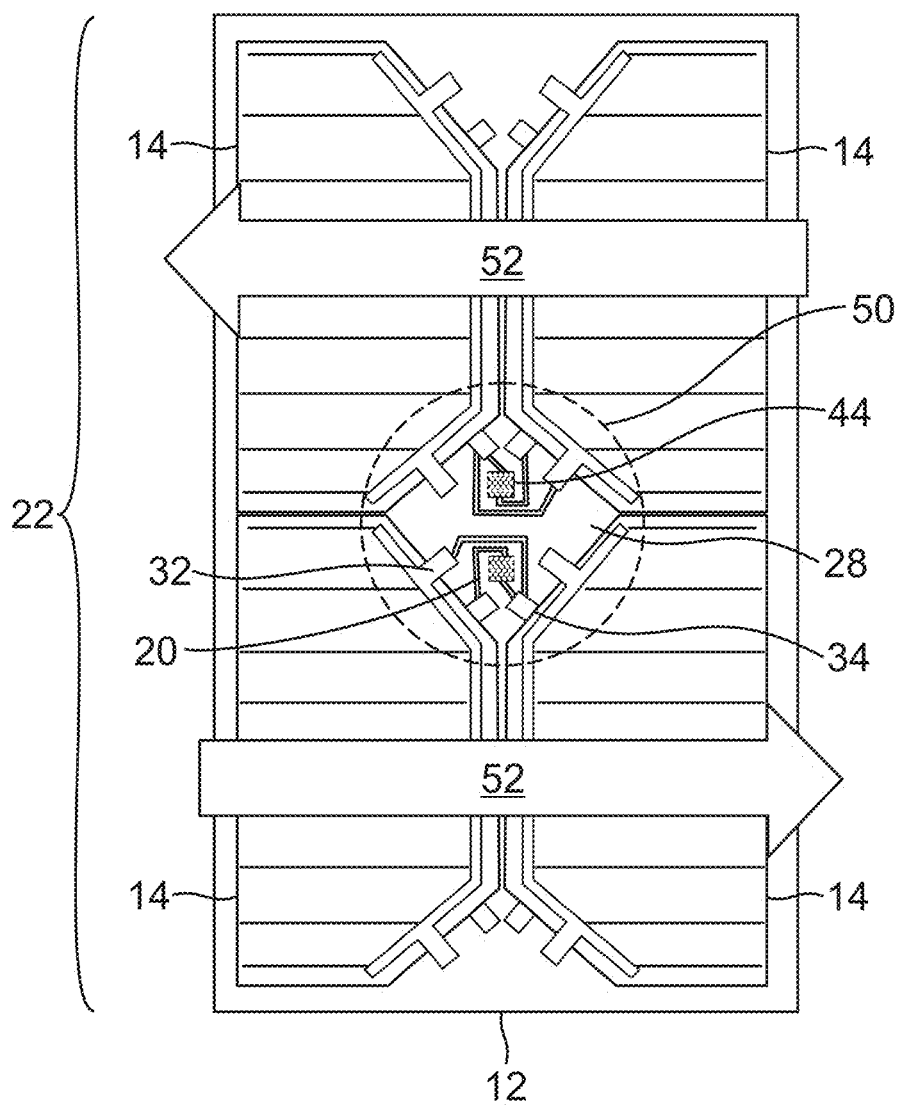
FIG. 13 shows left/right series connections between the cells of the array, according to one example.

In one example, the electrical connections are series connections that determine a flow of current through the plurality of solar cells 14. This may be accomplished by the connection schemes shown in FIGS. 12 and 13, wherein FIG. 12 shows up/down series connections 48 between the solar cells 14 of the array 22, and FIG. 13 shows left/right series connections 50 between the solar cells 14 of the array 22. In both FIGS. 12 and 13, these series connections 48, 50 are electrical connections between the front contacts 32 and back contacts 34 of the solar cells 14, and the bypass diodes 44, are made using the corner conductors 20 formed on or in the exposed areas 28 of the substrate 12. These series connections 48, 50 determine the current (power) flow, as indicated by the arrows 52, through the solar cells 14.

The corner conductors 20 between solar cells 14 can be in many forms. They could be accomplished using wires that have electrical connections made on both ends, which could be from soldering, welding, conducting adhesive, or other process. In addition to wires, metal foil connectors, similar to the interconnects, could be applied. Metal conductive paths or traces (not shown) can also be integrated with the substrate 12.

In summary, this new approach attaches the solar cells 14 individually to a substrate 12 such that the corner regions 26 of two, three or four adjacent solar cells 14 are aligned on the substrate 12. The solar cells 14 can be laid out so that the cropped corners 24 are aligned and the corner regions 26 are adjacent, thereby exposing an area 28 of the substrate 12. Electrical connections between solar cells 14 are made in these corner regions 26 between front contacts 32 and back contacts 34 on the solar cells 14, bypass diodes 44, and corner conductors 20 on or in the exposed area 28 of the substrate 12, wherein these conductive paths are used to create a string of solar cells 14 in a series connection 48, 50 comprising a circuit.

Solar Cell Array With Changeable String Length

A satellite power system requires power produced at a specific voltage which is produced by a plurality of series-connected solar cells 14. The voltage produced by each solar cell 14 varies depending primarily on the operating temperature, and electron and proton radiation history. The string is typically of a fixed length of solar cells 14 and designed to have enough solar cells 14 to reach the required voltage throughout the operation. Over many parts of the mission, the string is producing more voltage than needed. Effectively, one or more solar cells 14 are not contributing to power. This disclosure describes a way to reconfigure string lengths during operation so that power can be collected from each solar cell 14 throughout the mission. This results in the ability to produce strings operating with a constant total output voltage and produce higher power from the solar cell array 22.

A conventional triple junction solar cell 14 generates its maximum power at roughly 1.2A and 2.22V. This will change with operating temperature and with the accumulated dose of high energy electrons and protons in the space environment.

Of primary concern is the changing voltage. The power system often collects current at a specific voltage known as the load voltage. From the beginning of life (BOL) of the satellite to the end of life (EOL), the voltage may fall from 2.2 to 1.8V. In order to reach the load voltage, which may be 20V to 100V, many solar cells 14 are connected in series, so each solar cell 14 adds to the voltage of the string.

In one example, 45 solar cells 14 may be needed to have a maximum power point near 100V at BOL. At EOL, on the other hand, 55 solar cells 14 may be needed to have a 100V maximum power point. Thus, the additional 10 solar cells 14 at BOL are not contributing any power.

By implementing switches in the solar cell array 22, the string length can be reconfigured during operation. Specifically, the solar cell array 22 is reconfigured to have a string length that produces a maximum power point near the load voltage.

For example, a solar cell array 22 with 990 solar cells 14 can be split up into many strings to deliver power to a 100V power system. In order to deliver power at 100V at EOL, the solar cell array 22 will need 18 strings, each 55 solar cells 14 long, having a 100V maximum power point. The power output would be 18×100V×1.2 A=2160 W. A conventional solar cell array with a fixed string length would deliver this power at BOL and EOL. There would be some change of current and fill factor with radiation, but that is a secondary factor for this discussion.

Reconfiguration of the string length would deliver much higher power levels at BOL. At BOL, the solar cell array 22 could be reconfigured to use 22 strings, each with a length of 45 solar cells 14, to produce a maximum power point of 100V. The power output would be 22×100V×1.2 A=2640 W. This is 22% more power than the previous example. The solar cell array 22 can be reconfigured throughout its mission to change the string length from 45 to 55 solar cells 14. This will keep the voltage at the maximum power point near the load voltage of 100V and deliver optimal power.

A reconfigurable array 22 can also be advantageous in interplanetary missions, where radiation and operating temperature change greatly, thereby changing the solar cell 14 voltage.

Another application is where the load voltage may change. For example, during its early stages of operation, a satellite may move into its orbital position using electrical propulsion. The electrical propulsion system may prefer a higher load voltage, as compared to operations during other stages of the mission. Reconfigurability could be implemented to change the string length, so that the maximum power point of the string could change to 160V or 200V or 300V for electrical propulsion and then to 100V for other stages of the mission.

Reconfigurability requires several switches to be introduced into the solar cell array 22. To wire these switches into a conventional solar cell array requires the insertion of end tabs between the solar cell and the wiring, and the switches. The switches will also need signal electrical lines to communicate to them the desired state (open or closed). This would require extensive labor, cost, and panel area. Additionally, the extra connections also raise the risk of a problem developing. These costs and risks have outweighed the benefits and prevented reconfigurable arrays from being built.

However, a solar cell array 22 using the corner conductor 20 layout dramatically changes the cost to implement a reconfigurable array 22.

FIGS. 14A, 14B, 14C and 14D illustrate switches 54 used for changing a current flow path between the solar cells 14 and the electrical connections. In these figures, the switches 54 are single-pole single-throw (SPST) switches 54 packaged together in pairs, but other switches 54 may be used and the switches 54 may be packaged singly, in pairs, or as otherwise desired.

Figure 14A:
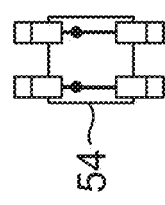
FIG. 14A shows two open switches.
Figure 14B:
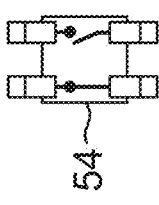
FIGS. 14B, 14C and 14D show three different configurations with one, two and one switches closed, respectively.
Figure 14C:
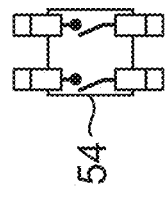
Figure 14D:
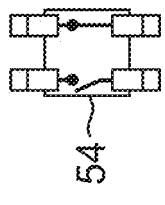

Each of the SPST switches 54 in the pair may be controlled independently or together using one or multiple control signals (not shown). FIG. 14A shows a pair of SPST switches 54 that are both open, FIG. 14B shows a pair of SPST switches 54 with the left one open and the right one closed, FIG. 14C shows a pair of SPST switches 54 that are both closed, and FIG. 14D shows a pair of SPST switches 54 with the left one closed and the right one open.

Figure 15:
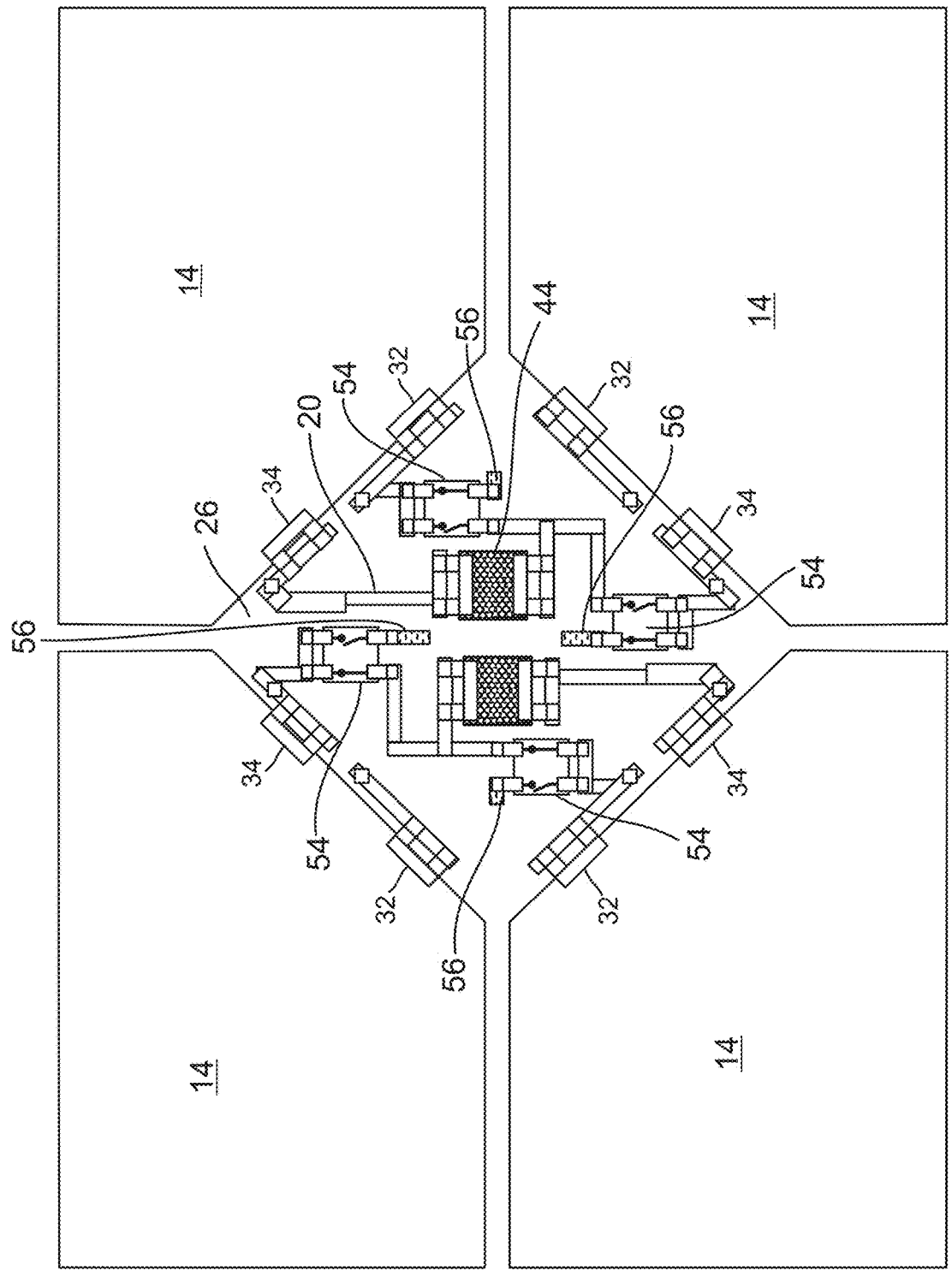
FIG. 15 shows a corner connection layout with the single-pole single-throw (SPST) switches.

FIG. 15 shows a layout where the switches 54 are positioned in the corner region 26. The pair of SPST switches 54 in the top center of the corner region 26 connects the back contact 34 of the top left solar cell 14 to either a string output line 56 or a series connection to a bypass diode 44 and the next solar cell 14 in the lower left. The photocurrent flows from the back contact 34 of the top left solar cell 14 to the front contact 32 of the lower left solar cell 14. The pair of SPST switches 54 on the left side of the corner region 26 allows the front contact 32 of the bottom left solar cell 14 to connect to the back contact 34 of the top left solar cell 14 in a series connection, and connects the front contact 32 of the bottom left solar cell 14 to the string output line 56.

These switches 54 enable the solar cells 14 to either have a series connection to another solar cell 14, or to terminate to buried V+ or V− string output lines 56. Moreover, the switches 54 enable the solar cells 14 to terminate at multiple connection paths. Similarly, the switches 54 can also have several connection paths, which all follow the logic laid out here.

The connections among the solar cells 14 on the right side of the corner region 26 are a 180 degree reflection of the connections among the solar cells 14 on the left side of the corner region 26. However, the configuration of the SPST switches 54 on the left side is reversed. On this side, the current flows from the back contact 34 of the lower right solar cell 14 to the buried V+ string output line 56 for string termination. The front contact 32 of the top right solar cell 14 is connected to the V− string output line 56.

The electrical connections made in the corner regions 26 use a common layout of the solar cells 14 regardless of whether they have a series connection or circuit output. No bus bars or wiring is needed, saving labor and panel 10a area. Furthermore, the layout of the electrical connections in the corner region 26 takes advantage of the ability to include patterned wiring in the substrate 12. More or less complex substrate 12 wiring layouts have no or minimal increase in costs. The additional wiring required by the switches 54 is simply built with little additional effort. This combination of traits is ideally suited to a reconfigurable solar cell array 22.

The pairs of SPST switches 54 may be operated so that one SPST switch 54 is closed when the other SPST switch 54 is open, which could be implemented using a dual-pole single-throw (DPST) switch 54. Moreover, the pair of SPST switches 54, or the DPST switch 54, could be implemented with one or more control signals. These SPST or DPST switches 54 could be electromechanical relays, or micro-electromechanical system (MEMS) relays, where a solid conductor is mechanically flexed to make and break conducting paths. A field effect transistor device is another switch 54 that is available built from Silicon (Si), Silicon Carbide (SiC), or Gallium Nitride (GaN).

Figure 16:
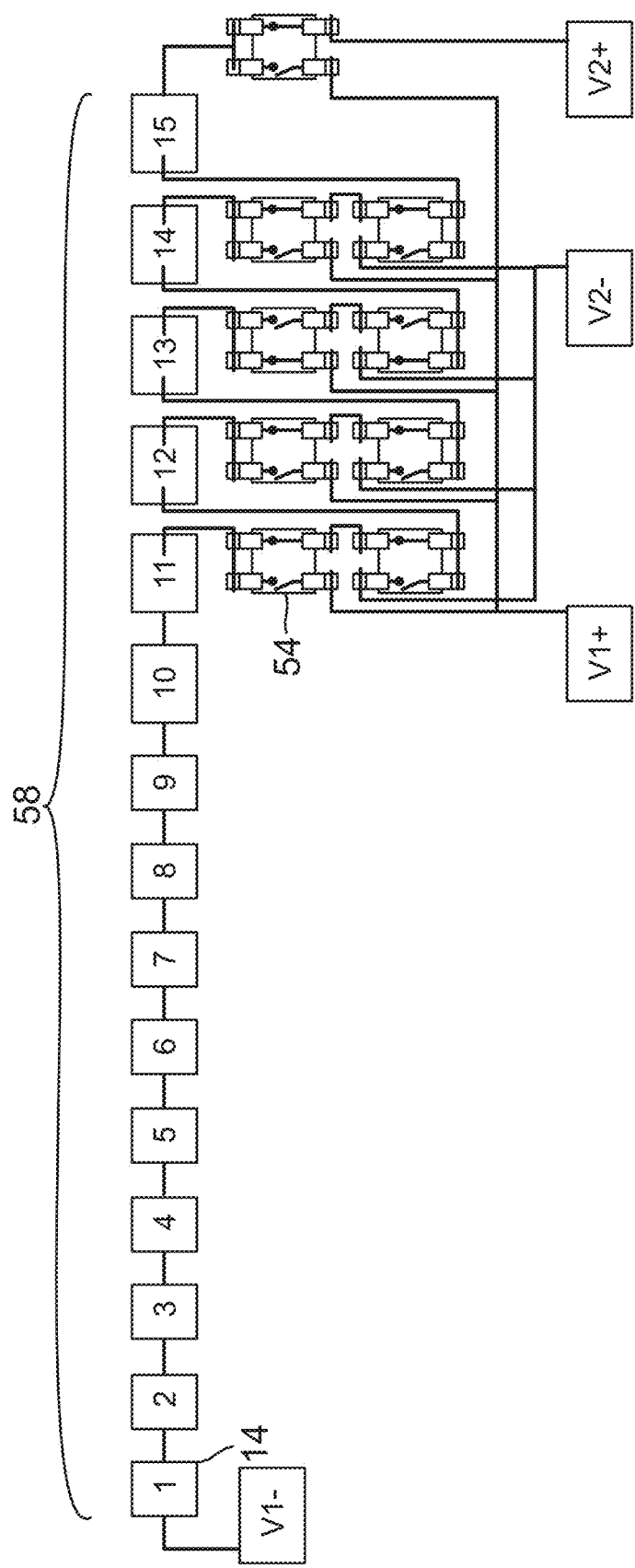
FIG. 16 shows an implementation of switches to vary the length of strings of solar cells.

FIG. 16 shows a group 58 of solar cells 14 labeled from 1 to 15. This group 58 can be split into two strings. There is a series of eight switches 54 between the solar cell 14 labeled as 11 to the solar cell 14 labeled as 15 that control the length of each of the two strings, and a ninth switch 54 coupled between the solar cell 14 labeled as 15 and the outputs V1+ and V2+. The switches 54 can make the length of a first string between 11 and 15 solar cells 14, and the length of a second string between 0 and 4 solar cells 14. There are 4 fixed output lines, wherein the output of the first string is V1− and V1+, and the output of the second string is V2− and V2+.

V1− always is set from the beginning of the string preceding the solar cell 14 labeled as 1. V1+ can be at any point after the solar cell 14 labeled as 11 to after the solar cell 14 labeled as 15, which may be the configuration at the end of life (EOL) when the solar cell 14 voltage has fallen. As drawn, V1+ terminates after the solar cell 14 labeled as 13, and V2+ always terminates after the solar cell 14 labeled as 15. As drawn, V2− terminates before the solar cell 14 labeled as 14.

This solar cell array 22 can allow the first string to reconfigure to have the needed string length to optimize the operating voltage. The second string would have a lesser voltage output. Multiple copies of the second string, using other groups 58, may need to be connected in series to reach the load voltage.

Figure 17:
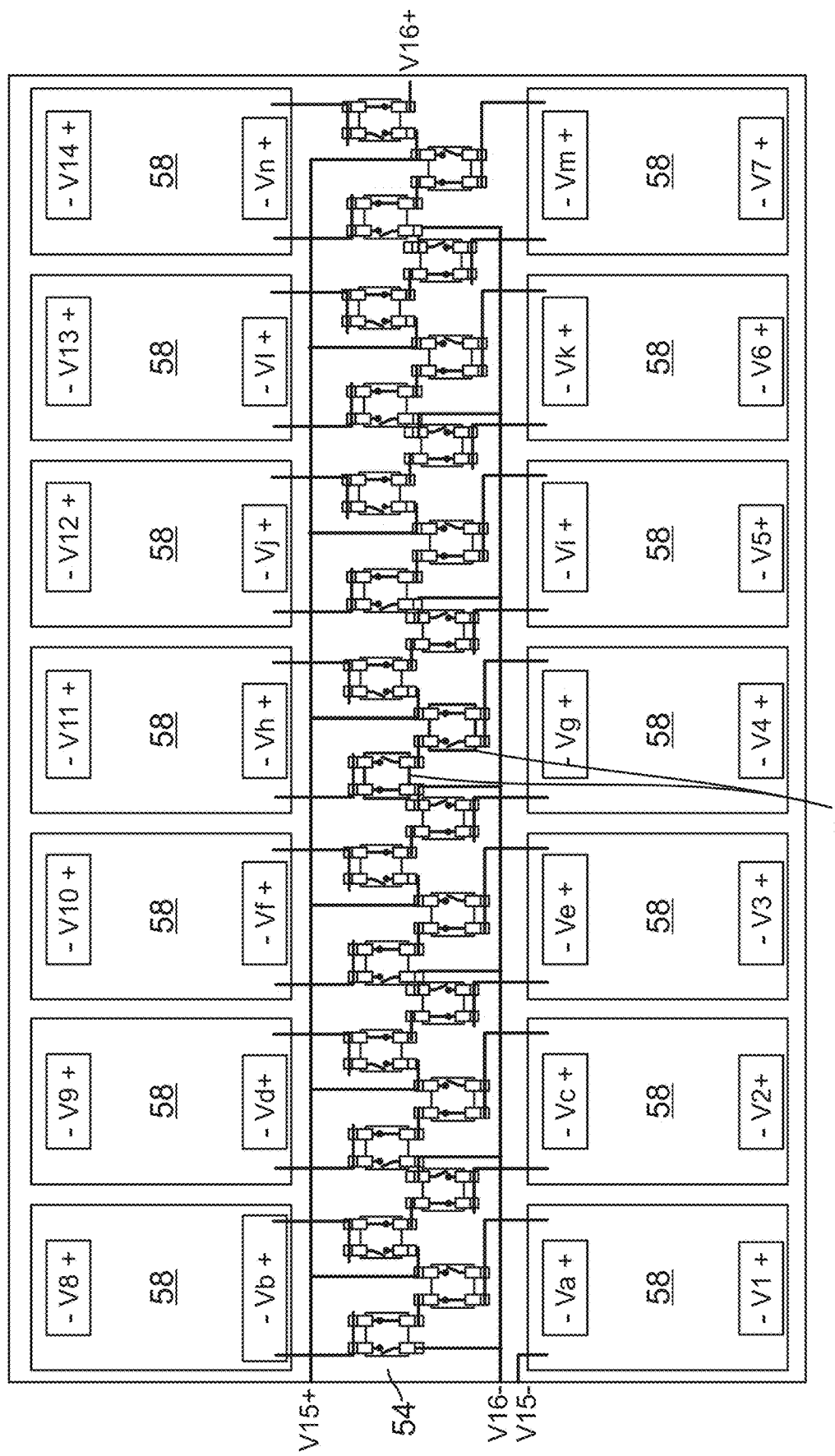
FIG. 17 is a layout that demonstrates how to combine short segments of solar cells into longer strings.

FIG. 17 is a layout that demonstrates how to combine the strings for a desired voltage output, and shows 14 groups 58 of solar cells 14. Each group 58 is comprised of the solar cells 14 and the switches 54 shown in FIG. 16. The first string of the solar cells 14 in each group 58 produces the desired voltage from 11-15 solar cells 14, which is connected to outputs V1, V2, . . . , V14. The second string of the solar cells 14 in each group 58 produces the desired voltage from 0-4 solar cells 14, which is connected to outputs Va, Vb, . . . , Vn.

The layout of FIG. 17 shows two rows of groups 58 with additional switches 54 between the rows for connecting the second strings from each of the groups 58. In this example, string output Va− is terminated directly to V15−. Va+ is connected to Vb− through two pairs of switches 54. The same occurs between Vb+ and Vc−, and continues across the groups 58. As shown, the switches 54 allow series connection from Va to Vg. In this example, the first string of each group 58 is 13 solar cells 14 long and the second string is 2 solar cells 14 long. The combination of segments that output Va to Vg is a string 14 solar cells 14 long. These are combined for output V15, which is 14 solar cells 14 long and produces sufficient voltage to be utilized by the system.

Between Vg+ and Vh−, the output is terminated at switches 54a. These terminating switches 54a show the change in the state of the switch elements 54. The terminating switches 54 terminate Vg+ into V15+ and Vh− into V16−. Then, Vh to Vn are series-connected, producing another string of 14 solar cells 14. Vn+ is connected to V16+.

Consequently, FIG. 16 shows how a group 58 of solar cells 14 can be reconfigured between a long first string with the desired voltage output and a short second string that is a fraction of the desired voltage, while FIG. 17 shows how those short second strings can be combined to produce the desired voltage.

The string lengths and layouts can change as needed. This disclosure is focused on the switching topology. To implement this wiring and switching on a conventional solar cell array would require extensive manual effort. The solar cell array 22 of this disclosure, where buried traces are patterned in the substrate 12, can accommodate complex wiring with minimal extra effort, making the complexity of the reconfigurable solar cell array 22 achievable.

There are many configurations where solar cells 14 could be switched to change the string length. FIG. 16 shows a group 58 comprised of 15 solar cells 14, where the string length can be changed by single solar cells 14. It may be advantageous to switch certain groups 58 of solar cells 14.

FIG. 18 demonstrates one such combination. FIG. 18 shows a solar cell array 22 with 24 solar cells 14 arranged in 4 rows of 6 columns. Solar cells 14 are labeled as 1-24, and are series-connected by line 60 along the sides (and tops) of the solar cells 14.

There are also traces 62 running left-right in the flex circuit substrate 12. These traces 62 are buried beneath, and are electrically isolated from, the solar cells 14 and are intended as string termination outputs. The traces 62 can be accessible in the corner regions 26 between solar cells 14, allowing any solar cell 14 to easily access the output lines 56.

Two of the buried traces 62 are labeled as A and B. These traces 62 could be accessed by the solar cells 14 labeled as 3, 4, 5, 6, 11, 12, 13, 14, 19, 20, 21, 22. This is a typical configuration described for a solar cell array 22 comprised of solar cells 14 connected in the corner regions 26. This is valuable for a reconfigurable solar cell array 22.

FIG. 19 shows how this can be used in a reconfigurable solar cell array 22. Here, the 24 solar cells 14 are shown smaller to allow more space to diagram the wiring and switching connections. The geometry shown is well suited to the use of electrical connections in corner regions 26. Between the solar cells 14 labeled as 11-12, 13-14, 19-20, 21-22, and after the solar cell 14 labeled as 24, there are switches 54 analogous to those in FIG. 16. These switches 54 could be implemented in the corner regions 26 as in FIG. 15, located between the solar cells 14 in the same column position. As in FIG. 16, there are two string outputs, namely, V1 for the first string and V2 for the second string. V2– and V1+ are accessed by each switch 54. Only single traces 62 for V1+ and V2– running under the solar cells 14 are needed to enable this switching.

The traces 64 are deposited on the surface of the substrate 12, and the traces 62 of V1+ and V2– are buried to pass beneath the surface traces 64. The vertical compound lines 66 indicate interconnects that connect the switches 54 to the buried traces 62, wherein the switches 54 are set so that the first string is 13 solar cells 14 long and the second string is 11 solar cells 14 long.

The V1 string can have a length of 11, 13, 19, 21, or 24 solar cells 14. This is accomplished with the buried trace 62 running between the solar cells 14 in rows 3 and 4. These connections to the output lines could move up a row so that it is between the solar cells in rows 2 and 3. This would result in string lengths of 10, 14, 18, 22, or 24. These different combinations result from the four-row solar cell array 22 with an output line running between two rows. Additional output lines could be added between other rows to enable more switching points and more control of the string length. However, this complexity will lead to crossing in the buried traces 62, requiring additional effort.

This layout is easily manufactured as no traces cross each other on the same layer, i.e., no crossing solid traces or crossing dashed traces. If these traces were to cross, then another metal layer and vias would be needed, which raise concerns about longevity in the space environment. This configuration with the corner connected solar cell array 22 having buried traces 62 in the substrate 12 allows for very simple connection paths. The configurations of FIGS. 16 and 17 were based on a group 58 of solar cells 14 split into a full voltage first string and a partial voltage second string. Then, the second strings of the groups 58 are connected together to build the needed voltage.

A related approach is shown in FIGS. 20A and 20B. FIG. 20A includes multiple groups 58 of solar cells 14, each having the same configuration as shown in FIGS. 16 and 17. Each group 58 includes first and second strings 68a, 68b, wherein the first strings 68a are full voltage strings and the second strings 68b are partial voltage strings, and multiple partial voltage second strings 68b across multiple groups 58 are connected together to provide the needed string length and output voltage.

FIG. 20B shows each group 58 split into two strings 68a, 68b of different lengths, wherein the first and second strings 68a, 68b from each group 58 are connected together to provide the needed string length. Specifically, the first string 68a of the first group 58 is a full voltage string; the second string 68b of the first group 58 is a partial voltage string that is combined with the first string 68a of the second group 58 to create a full voltage string; the second string 68b of the second group 58 is a partial voltage string that is combined with the first string 68a of the third group 58 to create a full voltage string; and the second string 68b of the third group 58 is a full voltage string.

Although the examples shown have only two strings 68a, 68b, these groups 58 could include a greater or lesser number of strings. Specifically, a group 58 could be comprised of 1, 2, 3, 4, etc., full voltage strings and zero, one or possibly multiple partial voltage strings.

FIGS. 16-20 have focused on reconfiguring by changing string length by a small number of solar cells 14 in order to control the output voltage. This is valuable as individual solar cell 14 voltages will change during the mission due to space radiation exposure and due to operating temperature changes.

FIGS. 21 and 22 apply reconfigurability to larger changes in string length. This could be for an application where the output voltage is desired to have a large change.

For example, during satellite operation, the solar cell array 22 is generally charging a set of batteries, where the load voltage may be at 100V or less. However, during mission stages, the satellite may use electric propulsion to change its orbit location, where the load voltage may be at 160V or 200V or 300V or other. It could be desirable for the solar cell array 22 to output the desired voltage for the different operations.

Another configuration would be with interplanetary missions, where the solar cell array 22 could become very hot or very cold as the distance to the sun changes. Alternatively, the solar cell array 22 temperature could change dramatically if the vehicle environment changes, such as if landing on an asteroid, or other object or planet. These changes in temperature will change the voltage produced by the solar cells 14 and the needed length of the string, which can be dramatic.

FIG. 21 shows a layout of solar cells 14 comprised of three flex sheet substrates 12, 12b, 12c. Each substrate 12a, 12b, 12c has a grid of 3 (horizontal)×27 (vertical) solar cells 14. The lower sections 12d of each substrate 12a, 12b, 12c have 58 solar cells 14 producing 100V. The upper sections 12e of each substrate 12a, 12b, 12c have 19, 19 and 20 solar cells 14, respectively, for a total of 58 solar cells 14. There are several solar cell 14 positions where a solar cell 14 is not included, as indicated by the rectangular elements 70 with the diagonal fill. The serpentine lines 72 show generally how the solar cells 14 in each section 12d, 12e of each substrate 12a, 12b, 12c are series-connected in a string. There are eight pairs of SPST switches 54 shown as triangles, wherein the switches 54 can be reconfigured so that each of the lower sections 12d are single strings and the upper sections 12e of each substrate 12a, 12b, 12c are series-connected together in a single string. In this configuration, every solar cell 14 is in a series-connected string having 58 solar cells 14. This is a configuration to produce 100V for a typical geosynchronous (GEO) near-earth environment after 10 years of radiation caused voltage loss.

FIG. 22 shows how the layout of FIG. 21 can be reconfigured using the switches 54. When series-connected, the lower sections 12d and upper sections 12e of each substrate 12a, 12b, 12c comprise strings that are 77 (58+19), 77 (58+19) and 78 (58+20) solar cells 14 long, respectively. The strings would produce 132V, 132V and 134V, respectively, under GEO conditions. Or, in a hot environment, the 100V output can be maintained.

In conclusion, this description involves the addition of switches 54 and wiring to a solar cell array 22 to achieve the reconfigurable functionality. The application of switches and wiring onto a conventional solar cell array would be extremely complicated and expensive. What makes the reconfigurable solar cell array 22 now possible is the use of wiring traces in the substrate 12 instead of conventional wires. Reconfigurability requires wiring in parallel to many or all the solar cells 14, whereas conventional wires only have a start and end connections. Traces in the substrate 12 can have many connections made to them at any point down the length of the trace. Therefore, traces can be routed under the solar cells 14 and very easily provide circuit output lines for all the solar cells 14. Furthermore, the front and back contacts 32, 34 of the solar cells 14 are available in the corner regions 26. Switches 54 can be added to achieve reconfigurability without consuming panel 10*a* area. The figures and descriptions show how reconfigurability can be at the solar cell 14 level, changing the number of solar cells 14 in a string and its resulting output voltage. Alternatively, reconfigurability can connect strings together building voltage in larger blocks.

In a conventional solar cell array, the addition of switches would require end tabs, wiring, switches, and circuit wiring. These components would need to be between any two solar cells that can be reconfigured. In addition to labor, these components would take considerable panel area, thereby reducing power production.

Fabrication

Examples of the disclosure may be described in the context of a method 74 of fabricating a solar cell 14, solar cell panel 10*a* and/or satellite, comprising steps 76-88, as shown in FIG. 23, wherein the resulting satellite 90 having a solar cell panel 10*a* comprised of solar cells 14 are shown in FIG. 24.

As illustrated in FIG. 23, during pre-production, exemplary method 74 may include specification and design 76 of the solar cell 14, solar cell panel 10*a* and/or satellite 90, and material procurement 78 for same. During production, component and subassembly manufacturing 80 and system integration 82 of the solar cell 14, solar cell panel 10*a* and/or satellite 90 takes place, which include fabricating the solar cell 14, solar cell panel 10*a* and/or satellite 90. Thereafter, the solar cell 14, solar cell panel 10*a* and/or satellite 90 may go through certification and delivery 84 in order to be placed in service 86. The solar cell 14, solar cell panel 10*a* and/or satellite 90 may also be scheduled for maintenance and service 88 (which includes modification, reconfiguration, refurbishment, and so on), before being launched.

Each of the processes of method 74 may be performed or carried out by a system integrator, a third party, and/or an operator (e.g., a customer). For the purposes of this description, a system integrator may include without limitation any number of solar cell, solar cell panel, satellite or spacecraft manufacturers and major-system subcontractors; a third party may include without limitation any number of venders, subcontractors, and suppliers; and an operator may be a satellite company, military entity, service organization, and so on.

As shown in FIG. 24, a satellite 90 fabricated by exemplary method 74 may include systems 92, a body 94, solar cell panels 10*a* comprised of solar cells 14, and one or more antennae 96. Examples of the systems 92 included with the satellite 90 include, but are not limited to, one or more of a propulsion system 98, an electrical system 100, a communications system 102, and a power system 104. Any number of other systems 92 also may be included.

FIG. 25 is an illustration of the solar cell panel 10*a* in the form of a functional block diagram, according to one example. The solar cell panel 10*a* is comprised of the solar cell array 22, which is comprised of one or more of the solar cells 14 individually attached to the substrate 12. Each of the solar cells 14 absorbs light 106 from a light source 108 and generates an electrical output 110 in response thereto.

At least one of the solar cells 14 has at least one cropped corner 24 that defines a corner region 26, such that an area 28 of the substrate 12 remains exposed when the solar cell 14 is attached to the substrate 12. When a plurality of solar cells 14 are attached to the substrate 12, the corner regions 26 of adjacent ones of the solar cells 14 are aligned, thereby exposing the area 28 of the substrate 12.

The area 28 of the substrate 12 that remains exposed includes one or more corner conductors 20 attached to, printed on, or integrated with the substrate 12, and one or more electrical connections between the solar cells 14 and the corner conductors 20 are made in a corner region 26 resulting from the cropped corner 24 of the at least one of the solar cells 14.

The corner region 26 resulting from the cropped corner 24 includes at least one contact, for example, a front contact 32 on a front side of the solar cell 14 and/or a back contact 34 on a back side of the solar cell 14, for making the electrical connections between the corner conductors 20 and the solar cell 14. The electrical connections may comprise up/down and/or left/right series connections that determine a flow of power through the solar cells 14, and may include one or more bypass diodes 44.

The area 28 of the substrate 12 that remains exposed includes at least one switch 54, located in the corner region 26 defined by the cropped corners 24 adjacent to the solar cells 14, for changing a current flow path between the solar cells 14 and the electrical connections. The substrate 12 includes one or more traces connected to the switches 54 for making the electrical connections between the solar cells 14.

The switches 54 reconfigure string lengths for the electrical connections between the solar cells 14 in response to a control signal. The switches 54 also reconfigure connections between strings allowing reconfigurability of series connections and outputs between the strings. The switches 54 may be single-pole single-throw (SPST) switches, or dual-pole single-throw (DPST) switches, and may be packaged singly, in pairs, or as otherwise desired.

Experimental Results

A solar cell array based on the corner conductor design and using a flex circuit substrate was built to demonstrate the reconfiguration of the string length of the array.

Figure 26A:
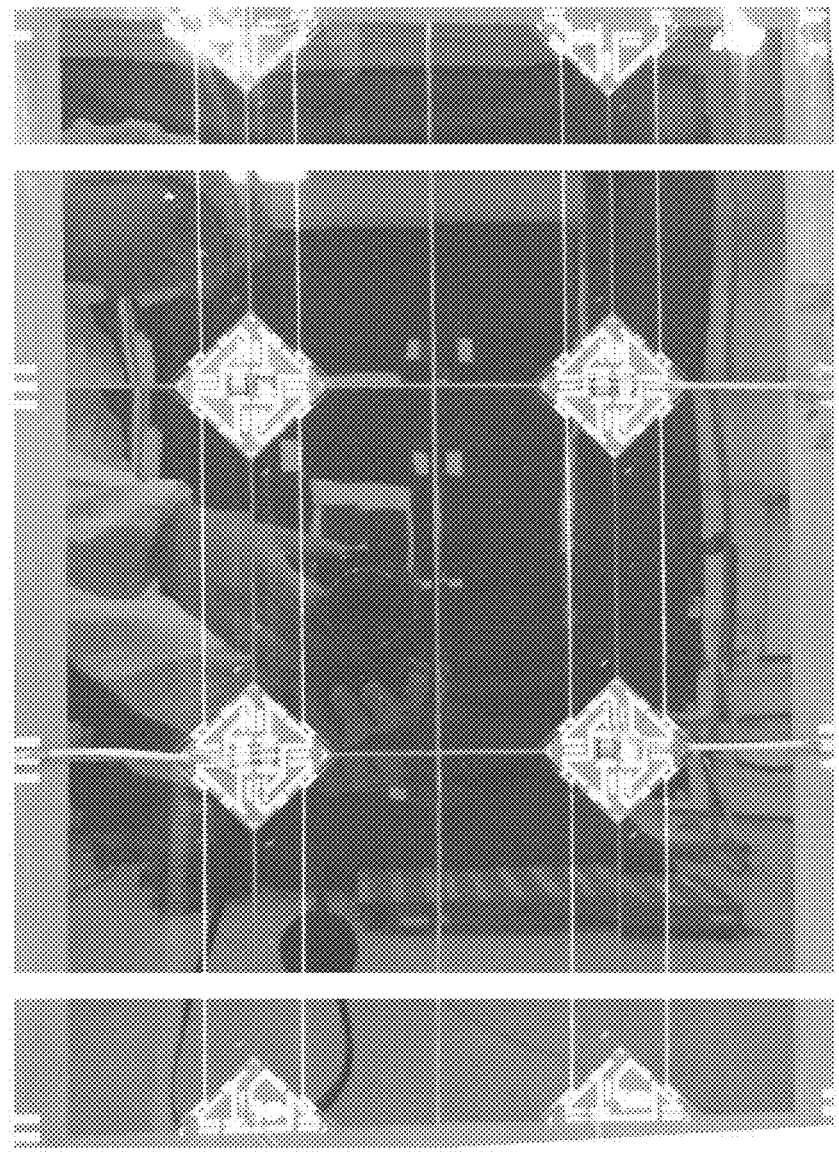

FIG. 26A is an image of a demonstration solar cell array comprised of 12 solar cells arranged in three rows with each row having four solar cells. Electrical connections are made in the corner regions to provide either series connections or string terminations. The current flow or conduction paths were selected by welding a metal foil jumper in place. Wire pairs were added at several locations instead of metal jumpers, wherein these wires extended beyond the perimeter of the solar cell array.

Figure 26B:
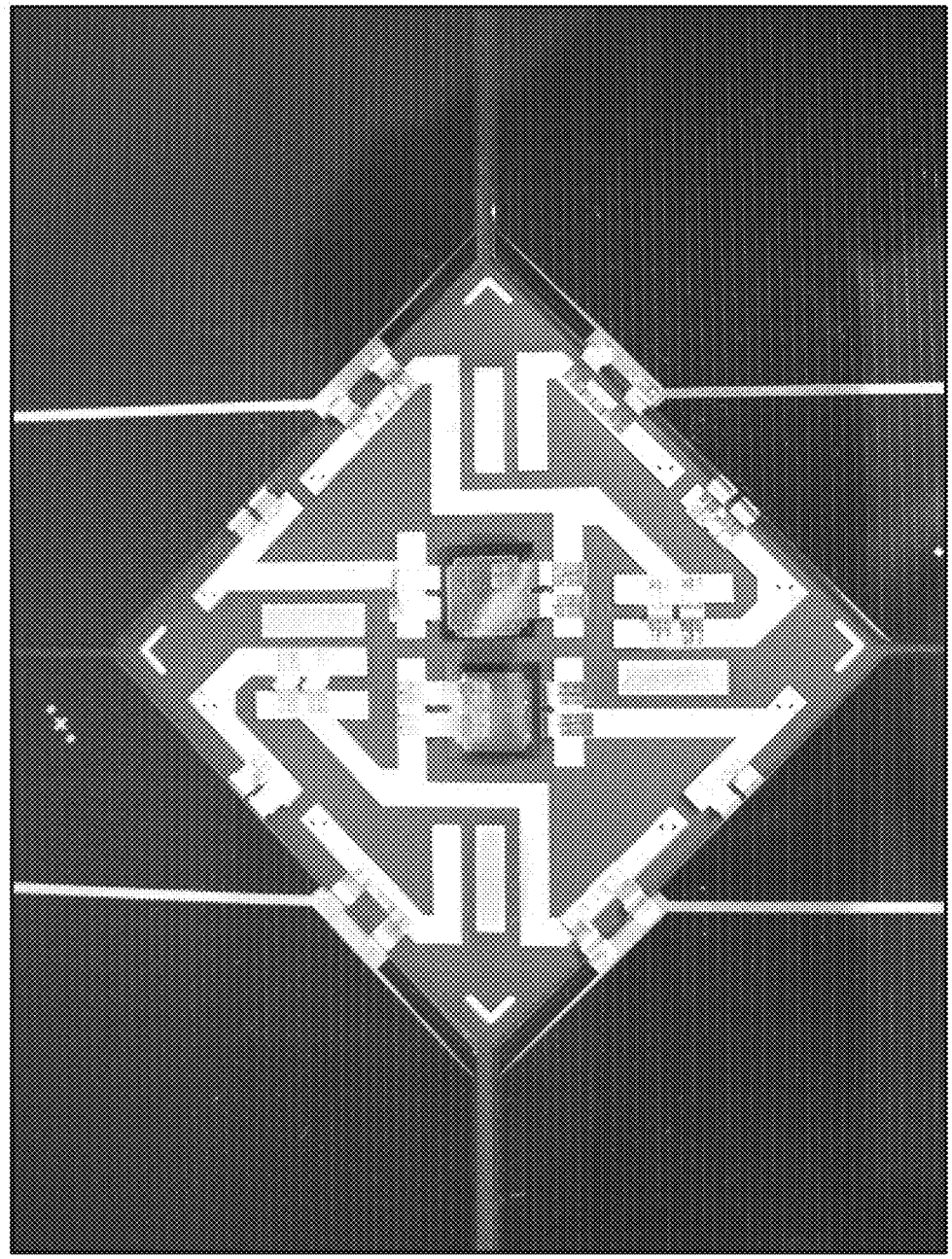

FIG. 26B is an image showing a close-up view of one of the corner regions showing the electrical connections between the front contacts, back contacts, bypass diodes, and solar cells.

Figure 26C:
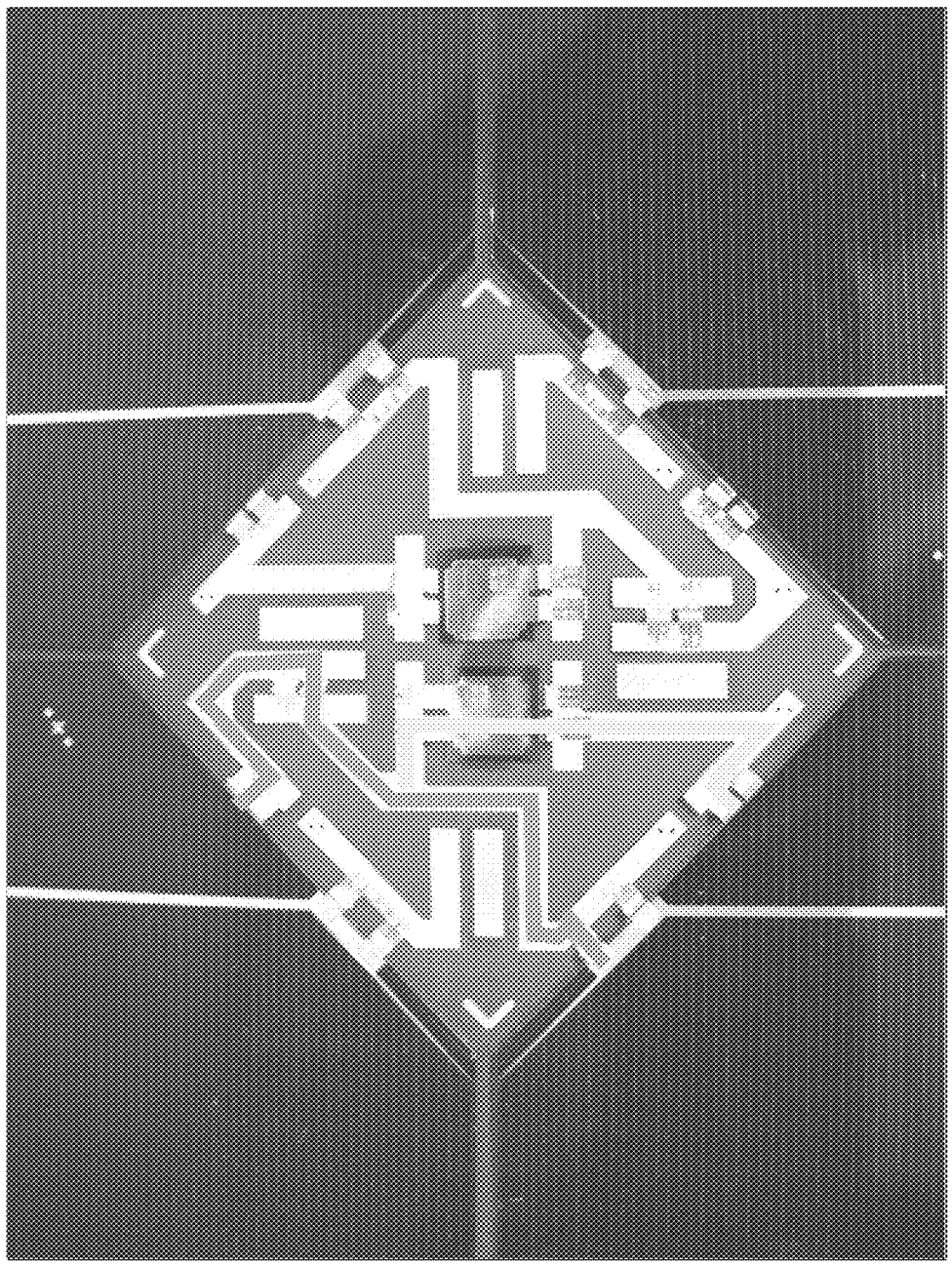

FIG. 26C is a version of FIG. 26B with the electrical connections between the upper left and the lower left solar cells indicated by the dark lines drawn over the conduction paths. One conduction path connects the back contact of the upper left solar cell to the front contact of the lower left solar cell, so that the current flows downward. Another conduction path connects the back contact of the lower left solar cell through the bypass diode.

The electrical connections between the upper right and the lower right solar cells are rotated 180 degrees as compared to the electrical connections between the upper left and the lower left solar cells, so that the current flows from the lower right solar cell to the upper right solar cell.

Jumpers are placed for series connections. By changing the jumper locations, the current flow can be terminated into buried traces.

Figure 26D:
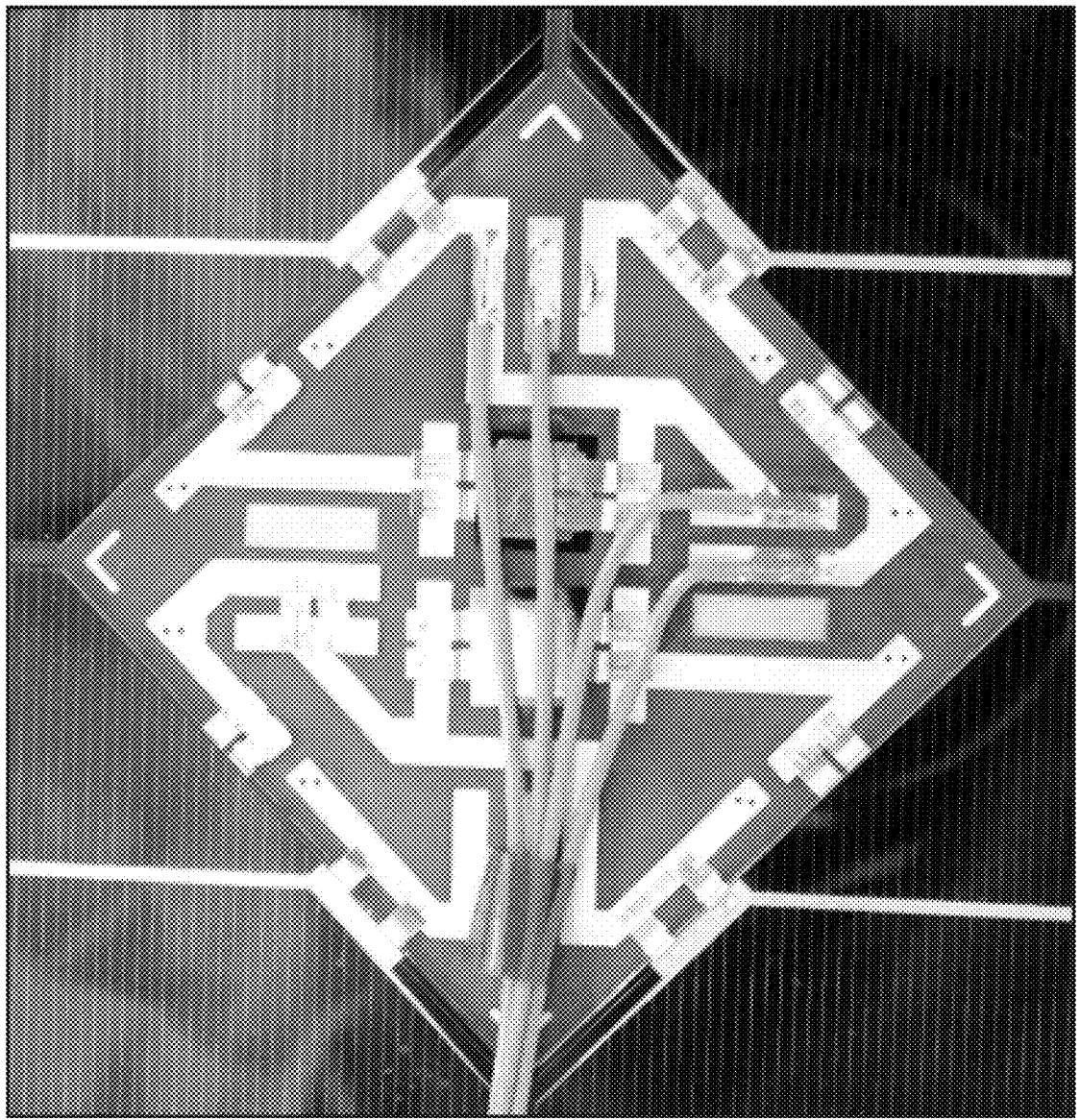

FIG. 26D is an image of another corner region where wires have been added in place of jumpers. The wires could be shorted together to function like a jumper, or the wires could be isolated to function like the lack of a jumper.

In this demonstration, through the use of jumpers or wires, the configuration of the solar cell array with 12 solar cells can be changed from 2 strings with 6 solar cells to 3 strings with 4 solar cells.

Figure 26E:
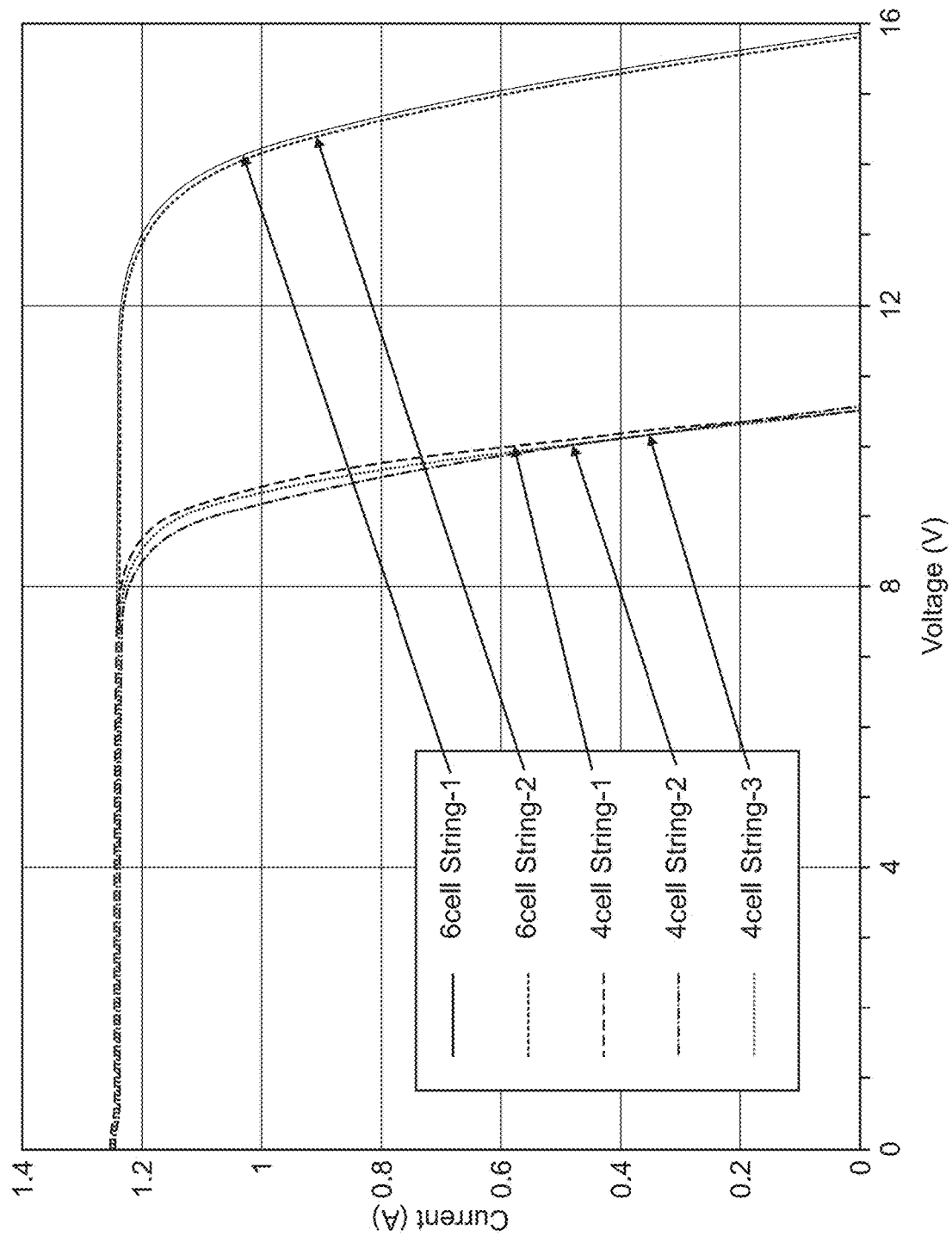

FIG. 26E is a graph of light-current-voltage (LIV) measurements of the solar cell array under AM0 (air mass coefficient for zero atmosphere) illumination, wherein the measurements were made of the configurations of 2 strings with 6 solar cells and 3 strings with 4 solar cells. The change in voltage confirms the change in string length.

Conclusion

The description of the examples set forth above has been presented for purposes of illustration and description, and is not intended to be exhaustive or limited to the examples described. Many alternatives, modifications and variations may be used in place of the specific elements described above.

What is claimed is:

1. A solar cell array, comprising:
   solar cells attached to a multi-layer substrate, wherein:
   the multi-layer substrate includes one or more insulating layers separating one or more patterned metal layers, and the patterned metal layers form traces buried within the multi-layer substrate;
   at least one of the solar cells has at least one cropped corner that defines a corner region;
   an area of the multi-layer substrate remains exposed in the corner region;
   the area of the multi-layer substrate that remains exposed in the corner region includes one or more electrical corner conductors attached to, printed on, or integrated with the multi-layer substrate that are electrically connected to the traces buried within the multi-layer substrate;
   one or more contacts of the at least one of the solar cells are electrically connected to the one or more electrical corner conductors using one or more interconnects in the area of the multi-layer substrate that remains exposed in the corner region;
   one or more switches positioned in the corner region, the one or more switches being connected to the traces within the multi-layer substrate, the one or more switches being controlled using one or more control signals, for changing a length of a string of one or more of the solar cells to generate a desired voltage output by altering a current flow path between one or more of the solar cells using the one or more contacts, the electrical corner conductors, and the traces buried within the multi-layer substrate, the string having a fixed output connection regardless of a status of the one or more switches; and
   the traces buried within the multi-layer substrate are electrically isolated from the solar cells until the one or more switches electrically connect the traces to the solar cells,
   wherein the one or more switches connects a back contact of a top left of the solar cells to a bypass diode and a next of the solar cells.

2. The solar cell array of claim 1, wherein the one or more switches change the string length for the one or more of the solar cells in response to the one or more control signals.

3. The solar cell array of claim 1, wherein the one or more switches change the string length to allow for reconfigurability of series connections and outputs between multiple strings.

4. The solar cell array of claim 1, wherein the one or more switches combine two or more strings of the solar cells for the desired voltage output in response to the one or more control signals.

5. A method for fabricating a solar cell array, comprising:
   attaching solar cells to a multi-layer substrate, wherein:
   the multi-layer substrate includes one or more insulating layers separating one or more patterned metal layers, and the patterned metal layers form traces buried within the multi-layer substrate;
   at least one of the solar cells has at least one cropped corner that defines a corner region;
   an area of the multi-layer substrate remains exposed in the corner region;
   the area of the multi-layer substrate that remains exposed in the corner region includes one or more electrical corner conductors attached to, printed on, or integrated with the multi-layer substrate that are electrically connected to the traces buried within the multi-layer substrate;
   one or more contacts of the at least one of the solar cells are electrically connected to the electrical corner conductors using one or more interconnects in the area of the multi-layer substrate that remains exposed in the corner region;
   one or more switches positioned in the corner region, the one or more switches being connected to the traces within the multi-layer substrate, the one or more switches being controlled using one or more control signals, for changing a length of a string of one or more of the solar cells to generate a desired voltage output by altering a current flow path between one or more of the solar cells using the one or more contacts, the electrical corner conductors, and the traces buried within the multi-layer substrate, the string having a fixed output connection regardless of a status of the one or more switches; and
   the traces buried within the multi-layer substrate are electrically isolated from the solar cells until the one or more switches electrically connect the traces to the solar cells,
   wherein the one or more switches connects a back contact of a top left of the solar cells to a bypass diode and a next lower left of the solar cells.

6. The method of claim 5, wherein the one or more switches change the string length for the one or more of the solar cells in response to the one or more control signals.

7. The method of claim 5, wherein the one or more switches change the string length to allow for reconfigurability of series connections and outputs between multiple strings.

8. The method of claim 5, wherein the one or more switches combine two or more strings of the solar cells for the desired voltage output in response to the one or more control signals.

9. A method of operating a solar cell array, comprising:
providing solar cells attached to a multi-layer substrate, wherein:
the multi-layer substrate includes one or more insulating layers separating one or more patterned metal layers, and the patterned metal layers form traces buried within the multi-layer substrate;
at least one of the solar cells has at least one cropped corner that defines a corner region;
an area of the multi-layer substrate remains exposed in the corner region;
the area of the multi-layer substrate that remains exposed in the corner region includes one or more electrical corner conductors attached to, printed on, or integrated with the multi-layer substrate that are electrically connected to the traces buried within the substrate;
one or more switches positioned in the corner region, the one or more switches being connected to the traces within the multi-layer substrate, the one or more switches being controlled using one or more control signals; and
activating one or more of the one or more switches for changing a length of a string of zere one or more of the solar cells to generate a desired voltage output by altering a current flow path between one or more of the solar cells using contacts, the electrical corner conductors, and the traces buried within the multi-layer substrate, the string having a fixed output connection regardless of a status of the one or more switches, wherein the traces buried within the multi- layer substrate are electrically isolated from the solar cells until the one or more switches electrically connect the traces to the solar cells,
wherein the one or more switches connects a back contact of a top left of the solar cells to a bypass diode and a next lower left of the solar cells.

10. The method of claim 9, wherein the one or more switches change the string length for the one or more of the solar cells in response to the one or more control sign als.

11. The method of claim 9, wherein the one or more switches change the string length to allow for reconfigurability of series connections and outputs between multiple strings.

12. The method of claim 9, wherein the one or more switches combine two or more strings of the solar cells for the desired voltage output in response to the one or more control signals.

13. The solar cell array of claim 1, wherein the one or more switches are single-pole single-throw (SPST) switches.

14. The solar cell array of claim 1, wherein the one or more switches are dual-pole single-throw (DPST) switches.

15. The method of claim 5, wherein the one or more switches are single-pole single-throw (SPST) switches.

16. The method of claim 5, wherein the one or more switches are dual-pole single-throw (DPST) switches.

17. The method of claim 9, wherein the one or more switches are single-pole single-throw (SPST) switches.

18. The method of claim 9, wherein the one or more switches are dual-pole single-throw (DPST) switches.

19. The method of claim 9, wherein the one or more switches are controlled independently using the one or more control signals.

20. The method of claim 9, wherein the one or more switches are controlled together using the one or more control signals.

* * * * *

UNITED STATES PATENT AND TRADEMARK OFFICE
CERTIFICATE OF CORRECTION

PATENT NO. : 12,490,523 B2
APPLICATION NO. : 15/787291
DATED : December 2, 2025
INVENTOR(S) : Eric Rehder Page 1 of 1

It is certified that error appears in the above-identified patent and that said Letters Patent is hereby corrected as shown below:

In the Claims

At Column 19, Line 24: "zere one or more" should be -- one or more --.

At Column 20, Line 6: "sign als" should be -- signals --.

Signed and Sealed this
Tenth Day of February, 2026

John A. Squires
*Director of the United States Patent and Trademark Office*